United States Patent
Weber et al.

(10) Patent No.: US 8,526,161 B2
(45) Date of Patent: Sep. 3, 2013

(54) BUTTON STRUCTURES FOR ELECTRONIC DEVICES

(75) Inventors: Trent Weber, Saratoga, CA (US); Michael B. Wittenberg, Mountain View, CA (US); Michelle A. Yu, Oakland, CA (US); Scott Myers, San Francisco, CA (US); Kurt Stiehl, San Jose, CA (US)

(73) Assignee: Apple Inc., Cupertino, CA (US)

( * ) Notice: Subject to any disclaimer, the term of this patent is extended or adjusted under 35 U.S.C. 154(b) by 437 days.

(21) Appl. No.: 12/794,651

(22) Filed: Jun. 4, 2010

(65) Prior Publication Data

US 2011/0255260 A1    Oct. 20, 2011

Related U.S. Application Data

(60) Provisional application No. 61/325,761, filed on Apr. 19, 2010.

(51) Int. Cl.
*H01G 5/01* (2006.01)

(52) U.S. Cl.
USPC ........... 361/288; 361/291; 361/287; 361/807; 361/808; 361/809; 361/810; 361/814

(58) Field of Classification Search
USPC ................. 361/288, 291, 287, 807–810, 814; 200/43.13, 5 E
See application file for complete search history.

(56) References Cited

U.S. PATENT DOCUMENTS

| | | | |
|---|---|---|---|
| 3,550,466 A * | 12/1970 | Ham | 74/471 XY |
| 3,609,256 A * | 9/1971 | Di Veto | 200/5 E |
| 3,731,013 A * | 5/1973 | Nightengale | 200/4 |
| 3,973,099 A * | 8/1976 | Morris, Sr. | 200/511 |
| 4,031,348 A * | 6/1977 | Eberhardt | 200/530 |
| 4,090,229 A * | 5/1978 | Cencel et al. | 361/288 |
| 4,124,787 A * | 11/1978 | Aamoth et al. | 200/6 A |
| 4,439,646 A * | 3/1984 | Bouvrande | 200/5 A |
| 4,747,131 A * | 5/1988 | Beirne | 379/372 |
| 4,803,380 A | 2/1989 | Jacoby et al. | |
| 5,129,277 A * | 7/1992 | Lautzenhiser | 74/471 XY |
| 5,258,592 A | 11/1993 | Nishikawa et al. | |

(Continued)

FOREIGN PATENT DOCUMENTS

CN    101336781    12/2008

OTHER PUBLICATIONS

Pennengineering "ReelFast SMT Surface Mount Fasteners Bulletin," 2004.

(Continued)

*Primary Examiner* — Tuan T Dinh
*Assistant Examiner* — Steven Sawyer
(74) *Attorney, Agent, or Firm* — Dorsey & Whitney LLP

(57) ABSTRACT

An electronic device may have buttons, a display, and a vibrator unit. Buttons may be included in electronic devices such as glass buttons, metal buttons, buttons that are assembled on printed circuit boards, and buttons that are partly formed from antenna structures. Button coatings may be used to improve the sliding performance of metal-on-metal buttons. A layer of polymer may be interposed between a button plate and a housing structure. A glass button member may have an underside on which a layer of patterned ink is formed. Elastomeric members may be used to reduce button rattle. Portions of a button may be provided with conductive features that form portions of an antenna.

17 Claims, 45 Drawing Sheets

(56) References Cited

U.S. PATENT DOCUMENTS

| | | | | |
|---|---|---|---|---|
| 5,499,919 | A | * | 3/1996 | Thomas ............... 434/45 |
| 5,675,309 | A | * | 10/1997 | DeVolpi ............... 338/68 |
| 5,763,824 | A | | 6/1998 | King |
| 5,952,631 | A | * | 9/1999 | Miyaki ............... 200/6 A |
| 5,952,715 | A | | 9/1999 | Sekiguchi |
| 6,133,657 | A | | 10/2000 | Semenik |
| 6,238,771 | B1 | * | 5/2001 | Nakao ............... 428/139 |
| 7,177,161 | B2 | | 2/2007 | Shima |
| 7,609,530 | B2 | | 10/2009 | Snider |
| 7,639,187 | B2 | | 12/2009 | Caballero |
| 7,658,095 | B2 | | 2/2010 | Sanford |
| 7,716,693 | B2 | | 5/2010 | Ahn et al. |
| 7,989,715 | B2 | | 8/2011 | Saito |
| 2001/0050677 | A1 | | 12/2001 | Tosaya |
| 2003/0117326 | A1 | * | 6/2003 | Doub et al. ............... 343/702 |
| 2003/0117787 | A1 | | 6/2003 | Nakauchi |
| 2004/0135767 | A1 | * | 7/2004 | Park ............... 345/156 |
| 2007/0232361 | A1 | * | 10/2007 | Park et al. ............... 455/566 |
| 2009/0159329 | A1 | | 6/2009 | Krohn |

OTHER PUBLICATIONS

Schmidt, Mathias et al. U.S. Appl. No. 12/728,171, filed Mar. 19, 2010.
Wang, Erik L. U.S. Appl. No. 12/472,192, filed May 26, 2009.
Sanford, Emery et al. U.S. Appl. No. 12/688,817, filed Jan. 15, 2010.
Mittleman, Adam D. et al. U.S. Appl. No. 12/113,902, filed May 1, 2008.
"How Stuff Works: Battery Pictures" [online] [retrieved on Dec. 9, 2009]: HowStuffWorks, Inc. 1998-2010 <URL:http://electronics.howstuffworks.com/battery-pictures1.htm>.
Park, Young-Bae et al. U.S. Appl. No. 12/785,395, filed May 21, 2010.
Mittleman, Adam D. et al. U.S. Appl. No. 12/113,910, filed May 1, 2008.
Mittleman, Adam D. et al. U.S. Appl. No. 12/113,908, filed May 1, 2008.
Wittenberg, Michael B. U.S. Appl. No. 12/789,387, filed May 27, 2010.
Dinh, Richard Hung Ming et al. U.S. Appl. No. 12/794,601, filed Jun. 4, 2010.
Dinh, Richard Hung Minh et al. U.S. Appl. No. 12/794,599, filed Jun. 4, 2010.
Weber, Trent et al. U.S. Appl. No. 12/794,664, filed Jun. 4, 2010.
Weber, Trent et al. U.S. Appl. No. 12/794,633, filed Jun. 4, 2010.
English Translation of JP1994-284970.

* cited by examiner

US 8,526,161 B2

BUTTON STRUCTURES FOR ELECTRONIC DEVICES

This application claims the benefit of provisional patent application No. 61/325,761, filed Apr. 19, 2010, which is hereby incorporated by reference herein in its entirety.

BACKGROUND

This relates generally to electronic devices and components for electronic devices.

Electronic devices such as cellular telephones include numerous electronic and mechanical components. Care should be taken that these components are durable, attractive in appearance, and exhibit good performance. Tradeoffs must often be made. For example, it may be difficult to design a robust mechanical part that is attractive in appearance. The designs for attractive and compact parts and parts that perform well under a variety of operating environments also pose challenges.

It would therefore be desirable to be able to provide improved electronic devices and parts for electronic devices.

SUMMARY

Electronic devices may be provided that include mechanical and electronic components. These components may include mechanical structures such as mounting structures and electrical components such as integrated circuits, printed circuit boards, and electrical devices that are mounted to printed circuit boards. Optical components, connectors, antennas, buttons, and other structures may be included in an electronic device.

An electronic device may have a housing. Electronic components and mechanical structures may be formed within the housing. To ensure that the electronic device is attractive, attractive materials such as metal and plastic may be used to form parts of an electronic device. Compact size may be achieved by using compact internal mounting structures. Good electrical performance may be achieved by designing an electronic device to handle a variety of thermal and electrical loads.

Buttons may be included in electronic devices such as glass buttons, metal buttons, buttons that are assembled on printed circuit boards, and buttons that are partly formed from antenna structures. Button coatings may be used to improve the sliding performance of metal-on-metal buttons. Elastomeric members may be used to reduce button rattle.

Vibrator units may be used to vibrate an electronic device in response to an incoming telephone call, calendar entry, or other event. A tapered counterweight may be used to save space.

DETAILED DESCRIPTION

Electronic devices can be provided with mechanical and electronic components such as optical parts, camera mounting structures, cowlings and other cosmetic parts, printed circuits and support structures, thermal management structures, buttons, vibrators, and other mechanical and electrical structures.

Electronic devices that may be provided with these components include desktop computers, computer monitors, computer monitors containing embedded computers, wireless computer cards, wireless adapters, televisions, set-top boxes, gaming consoles, routers, portable electronic devices such as laptop computers, tablet computers, and handheld devices such as cellular telephones and media players, and small devices such as wrist-watch devices, pendant devices, headphone and earpiece devices, and other wearable and miniature devices. Portable devices such as cellular telephones, media players, and other handheld electronic devices are sometimes described herein as an example.

An electronic device may be provided with a glass button. Layers of patterned material may be formed on the underside of the glass button member.

A housing structure such as a plate may be connected to the housing sidewalls. Ports such as ports for an audio jack and a microphone may be formed in the housing sidewalls. An audio jack may be mounted to the housing plate adjacent to the audio jack port. A microphone may be mounted between the audio jack and the housing sidewall. A vibrator may be mounted between one of the sidewalls and the audio jack using a bracket.

A button may have a button member with a protrusion that extends through the button opening in the sidewall. A support structure may be interposed between a switch and the button member. The switch may have a portion that extends through an opening in the support structure. A lubricating coating may be formed between the button member and the housing sidewall.

Portions of a button may be provided with conductive features that form portions of an antenna. The conductive features may include sheet metal inserts and conductive traces that are formed directly on plastic parts. With one suitable arrangement, a button support member may be provided with a metal trace and a sheet metal insert.

Mounting structures may be provided for attaching button assemblies to the inside of electronic device housing. An integral spring may be attached to the inside of the housing. A button plate may have button members and an opening through which the spring may be inserted, attaching the button plate through the housing.

Button assemblies may be provided with a member such as a silicone sheet that is interposed between the housing and button plates. This layer of material may reduce undesired motion and rattle of the buttons.

Figure 1:
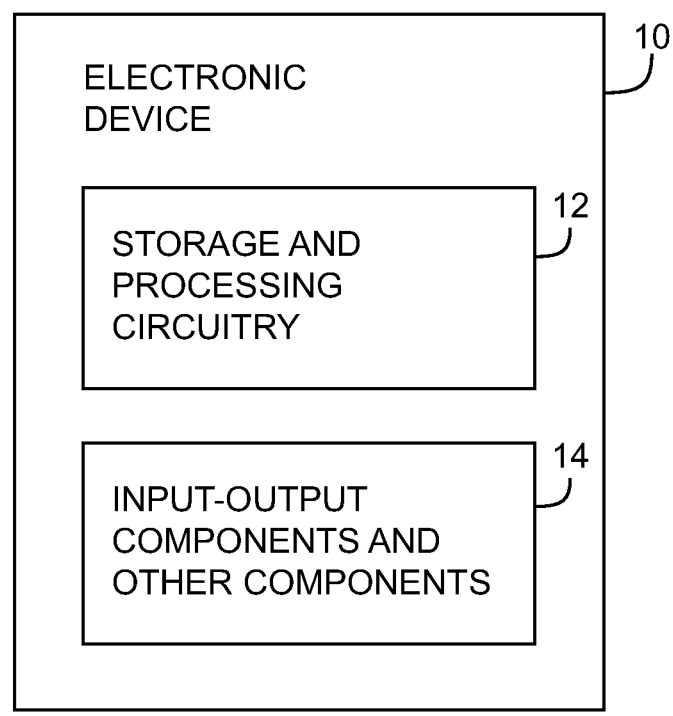
FIG. 1 is a schematic diagram of an illustrative electronic device in accordance with an embodiment of the present invention.

An illustrative electronic device that may be provided with mechanical and electrical features to improve performance, aesthetics, robustness, and size is shown in FIG. 1. As shown in FIG. 1, device 10 may include storage and processing circuitry 12. Storage and processing circuitry 12 may include one or more different types of storage such as hard disk drive storage, nonvolatile memory (e.g., flash memory or other electrically-programmable-read-only memory), volatile memory (e.g., static or dynamic random-access-memory), etc. Storage and processing circuitry 12 may be used in controlling the operation of device 10. Processing circuitry in circuitry 12 may be based on processors such as microprocessors, microcontrollers, digital signal processors, dedicated processing circuits, power management circuits, audio and video chips, and other suitable integrated circuits.

With one suitable arrangement, storage and processing circuitry 12 may be used to run software on device 10, such as internet browsing applications, voice-over-internet-protocol (VOIP) telephone call applications, email applications, media playback applications, operating system functions, antenna and wireless circuit control functions, etc. Storage and processing circuitry 12 may be used in implementing suitable communications protocols. Communications protocols that may be implemented using storage and processing circuitry 12 include internet protocols, wireless local area network protocols (e.g., IEEE 802.11 protocols—sometimes referred to as Wi-Fi®), protocols for other short-range wireless communications links such as the Bluetooth® protocol, protocols for handling cellular telephone communications services, etc.

Input-output devices 14 may be used to allow data to be supplied to device 10 and to allow data to be provided from device 10 to external devices. Examples of input-output devices 14 that may be used in device 10 include display screens such as touch screens (e.g., liquid crystal displays or organic light-emitting diode displays), buttons, joysticks, click wheels, scrolling wheels, touch pads, key pads, keyboards, microphones, speakers and other devices for creating sound, cameras, sensors, etc. A user can control the operation of device 10 by supplying commands through devices 14 or by supplying commands to device 10 through an accessory that communicates with device 10 through a wireless or wired communications link. Devices 14 or accessories that are in communication with device 10 through a wired or wireless connection may be used to convey visual or sonic information to the user of device 10. Device 10 may include connectors for forming data ports (e.g., for attaching external equipment such as computers, accessories, etc.).

Electronic devices are often controlled using buttons. Buttons are typically formed from metal or plastic. Metal is durable and can be used to form shiny buttons. Plastic may be provided in different colors and can be inexpensive.

For aesthetic reasons, it may be desirable for a button to have an appearance that matches surrounding structures. A device with a metal housing may, as an example, be provided with matching metal buttons.

Some devices have glass surfaces. For example, some cellular telephones have glass displays. In this type of environment, it may be desirable to form a button that matches the appearance of the glass display. Plastic buttons may not match the appearance of a glass display as well as desired and may be prone to scratches. Metal buttons might offer improved durability, but typically would be even more dissimilar in appearance to the glass display than a plastic button.

It would therefore be desirable to be able to provide an electronic device with improved button structures.

An electronic device such as a cellular telephone may have a display. The display may have a layer of cover glass on its exterior surface. Additional layers such as a layer of image pixels and a layer of capacitive electrodes for implementing a capacitive touch sensor array may be formed under the cover glass.

The cover glass may be provided with one or more openings. For example, a circular opening may be formed in the cover glass in an inactive portion of the display.

A button such as a glass button may be mounted in the circular opening. A user may actuate the button to make menu selections and perform other device functions during operation of the electronic device.

The button may have a glass button member such as a disk-shaped glass button member. The glass button member may be formed from transparent glass (e.g., a thin clear disk of glass). An optional concave indentation may be formed in the upper surface of the glass button member.

The glass button member may have an exterior surface that lies parallel to the exterior of the device and the exposed surface of the cover glass. The glass member may have a parallel planar underside that lies towards the interior of the electronic device.

Layers of patterned material may be formed on the underside of the glass button member. For example, a layer of patterned ink may be formed on the underside of the glass button member. Another layer of material such as a background layer of ink may be formed on top of the deposited layer of patterned ink. The layer of patterned ink may be, for example, a patterned white ink layer. The background layer may have a different color than the patterned ink layer, so that the patterned ink layer is visible to the user through the glass button member. The background layer may be, for example, a layer of black ink.

The glass button member may be mounted to a base structure. The base structure may include a plastic base layer. A layer of adhesive may be used to attach the glass button layer to the plastic base layer. The layer of adhesive may be interposed between the background layer of ink and the plastic base layer.

Protrusions or other portions of the plastic base layer may extend under edge portions of the cover glass. The cover glass edge portions may bear against the extensions in the plastic base, thereby capturing the button within the electronic device.

A dome switch or other switch mechanism may be coupled to the glass button member. As the glass button member reciprocates within the opening in the cover glass, the dome switch is activated. Processing circuitry within the electronic device may sense the state of the dome switch during operation.

In accordance with an embodiment, a button is provided that includes a glass button member having an exterior surface and a lower button member surface, and at least one patterned layer of material on the lower button member surface.

In accordance with another embodiment, a button is provided wherein the glass button member is clear and wherein the patterned layer of material comprises ink.

In accordance with another embodiment, a button is provided wherein the at least one patterned layer of material includes a first patterned layer of ink on the lower button member surface, and a second layer of ink that covers the lower button member surface and that covers the first patterned layer of ink.

In accordance with another embodiment, a button is provided wherein the first patterned layer of ink and the second layer of ink have different colors.

In accordance with another embodiment, a button is provided wherein the first patterned layer of ink has a first color, wherein the second layer of ink has a second color, and wherein the first color is lighter than the second color.

In accordance with another embodiment, a button is provided wherein the first color is white and wherein the second color is black.

In accordance with another embodiment, a button is provided wherein the glass button member comprises a clear circular glass disk member and wherein the at least one layer of patterned material comprises a patterned first layer of ink on the lower button member surface and a second layer of ink that covers substantially all of the patterned first layer of ink and that covers the lower button member surface.

In accordance with another embodiment, a button is provided wherein the glass button member comprises a disk with a chamfered edge, the button further comprising a dome switch attached to the glass button member.

In accordance with another embodiment, a button is provided that also includes a base member to which the button member is attached with a layer of adhesive.

In accordance with another embodiment, a button is provided wherein the at least one layer of patterned material comprises first and second layers of ink of different colors interposed between the button member and the layer of adhesive.

In accordance with an embodiment, a method of forming a button is provided that includes forming a patterned layer of ink on an underside of a transparent button member, wherein the patterned layer of ink has a first color, and forming a background layer of ink covering substantially all of the underside of the transparent button member and covering the patterned layer of ink, wherein the background layer of ink has a second color that is different than the first color.

In accordance with another embodiment, a method is provided wherein the first color is white, wherein the transparent button member comprises a clear glass disk, and wherein the second color is black, the method further comprising attaching the button member to a base member.

In accordance with another embodiment, a method is provided wherein the base member comprises a plastic member and wherein attaching the button member to the base member comprises using adhesive to attach the button member to the plastic member.

In accordance with another embodiment, a method is provided wherein using the adhesive to attach the button member to the plastic member comprises interposing a layer of adhesive between the background layer of ink and the plastic member.

In accordance with an embodiment, an electronic device is provided that includes a housing, a display in the housing, wherein the display comprises a layer of glass having an opening, and a glass button mounted in the opening.

In accordance with another embodiment, an electronic device is provided wherein the display comprises a touch screen display, wherein the glass button comprises a glass button member with an underside and a patterned layer of ink that is formed on the underside.

In accordance with another embodiment, an electronic device is provided wherein the glass button further comprises a background layer of ink that covers the patterned layer of ink.

In accordance with another embodiment, an electronic device is provided wherein the button further comprises a dome switch that is coupled to the glass button member.

In accordance with another embodiment, an electronic device is provided wherein the patterned layer of ink comprises ink of a first color and wherein the background layer of ink comprises ink of a second color that is different than the first color.

In accordance with another embodiment, an electronic device is provided wherein the button comprises a plastic base member to which the glass button member is attached using a layer of adhesive.

In accordance with these embodiments, buttons may be used in electronic devices to control menu functions or other operations. The electronic devices in which the buttons are used may be portable electronic devices such as laptop computers or small portable computers of the type that are sometimes referred to as ultraportables. Portable electronic devices may also be somewhat smaller devices. Examples of smaller portable electronic devices include wrist-watch devices, pendant devices, headphone and earpiece devices, and other wearable and miniature devices.

If desired, the electronic devices in which the buttons are provided may be, for example, handheld wireless devices such as cellular telephones, media players with wireless communications capabilities, handheld computers (also sometimes called personal digital assistants), remote controllers, global positioning system (GPS) devices, and handheld gaming devices. The electronic devices may also be hybrid devices that combine the functionality of multiple conventional devices. Examples of hybrid portable electronic devices include a cellular telephone that includes media player functionality, a gaming device that includes wireless communications capabilities, a cellular telephone that includes game and email functions, and a portable device that receives email, supports mobile telephone calls, has music player functionality and supports web browsing. These are merely illustrative examples.

Figure 2A:
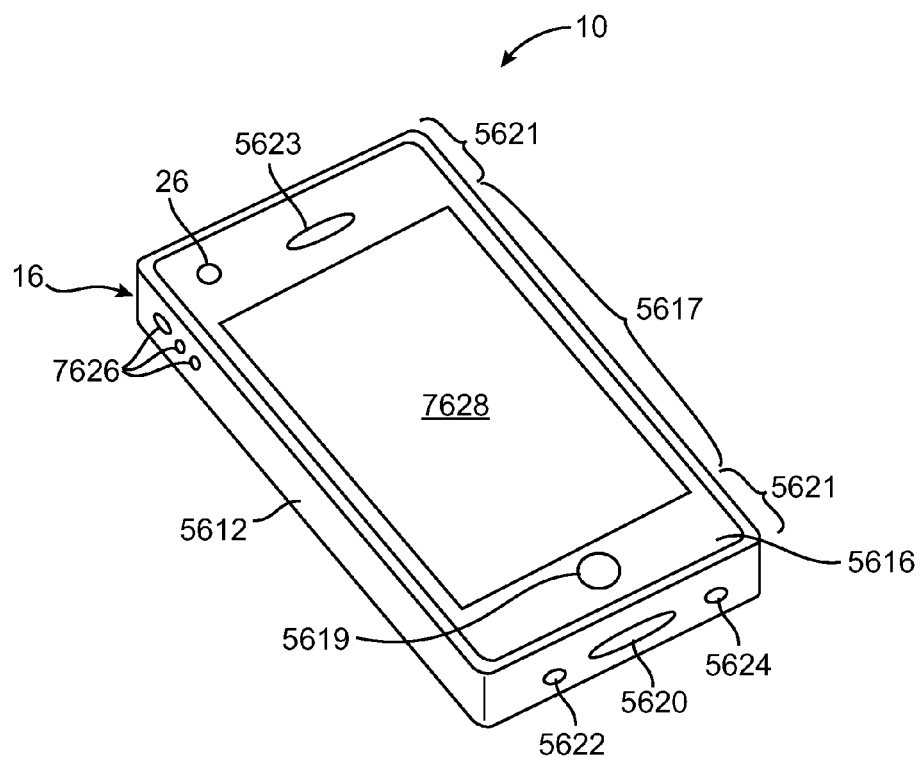
FIG. 2A is a front perspective view of an illustrative electronic device that may be provided with a button in accordance with an embodiment of the present invention.
Figure 2B:
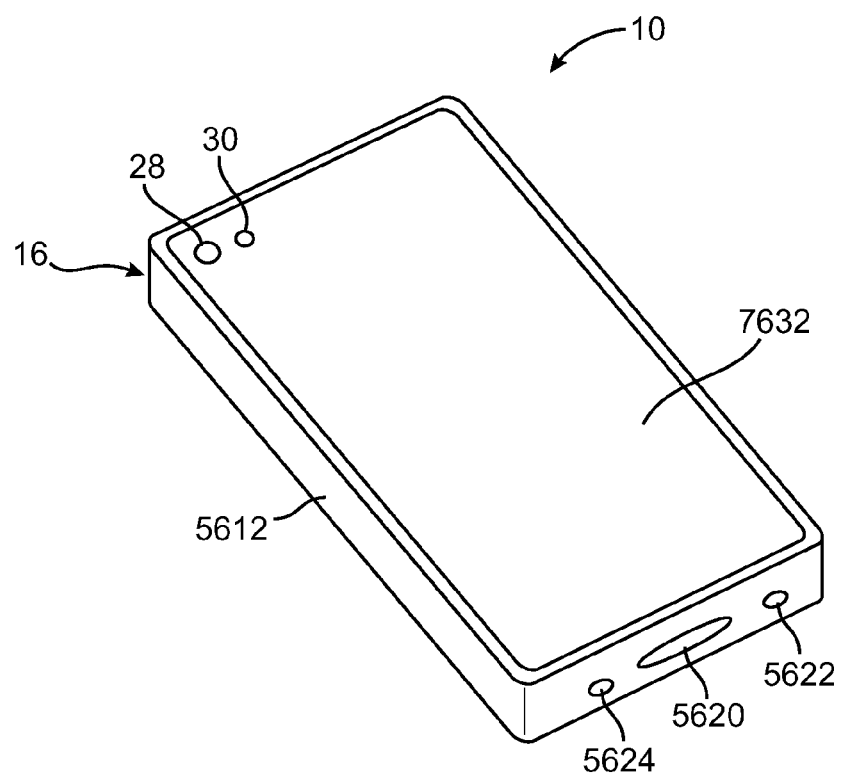
FIG. 2B is a rear perspective view of an illustrative electronic device that may be provided with a button in accordance with an embodiment of the present invention.

An illustrative electronic device of the type that may be provided with a button is shown in FIGS. 2A and 2B. Device 10 of FIG. 2 may be, for example, a handheld electronic device that supports 2G and/or 3G cellular telephone and data functions, global positioning system capabilities, and local wireless communications capabilities (e.g., IEEE 802.11 and Bluetooth®) and that supports handheld computing device functions such as internet browsing, email and calendar functions, games, music player functionality, etc.

Device 10 may have housing 16. Housing 16, which is sometimes referred to as a case, may be formed of any suitable materials including, plastic, glass, ceramics, metal, or other suitable materials, or a combination of these materials. In some situations, housing 16 or portions of housing 16 may be formed from a dielectric or other low-conductivity material. Housing 16 or portions of housing 16 may also be formed from conductive materials such as metal.

Housing 16, which is sometimes referred to as a case, may be formed of any suitable materials including, plastic, glass, ceramics, carbon-fiber composites and other composites, metal, other suitable materials, or a combination of these materials. A unibody construction may be used for device 10 in which case some or all of housing 16 may be formed from a single piece of material. Housing 16 may, for example, be formed from a piece of plastic or metal that covers the sidewalls of device 10 and that covers the rear surface of device 10. Frame members and other components may be mounted in the unibody housing. With another illustrative arrangement, housing 16 may be implemented using multiple structures that are assembled together. For example, housing 16 may be formed from a central frame 5612 to which a front and/or rear panels 5616 and 7632 are attached (as an example). In some cases, the front and/or rear panels may include an outer transparent layer (e.g., cover glass). Other configurations may be used if desired. In one embodiment, the panels may be removable. For example, the rear panel may be detached from the rest of the housing in order to provide internal access to the electronic device. In one example, the rear panel is made to slide relative to the rest of the housing between a closed position, enclosing the device, and an open position, providing an opening.

A display such as display 7628 may be mounted in housing 16. Display 7628 may, for example, be mounted on the front surface of device 10 as shown in FIG. 2. Display 7628 may be a liquid crystal display (LCD), an organic light emitting diode (OLED) display, an electronic ink display, a plasma display, or any other suitable display. The outermost surface of display 7628 may be formed from a layer of glass 5616 (sometimes referred to as the display's cover glass). Display 7628 may also have interior layers (e.g., a capacitive touch sensor array for providing display 7628 with touch sensing capabilities, a layer of thin-film transistors for controlling the image pixels in the display, etc.).

Display 7628 may have a central active region such as active region 5617 and inactive end regions such as regions 5621. To hide interior portions of device 10 from view, the underside of display 7628 (e.g., the cover glass of the display) in inactive regions 5621 may be coated with an opaque substance such as black ink (as an example). An opening may be formed in one of regions 5621 to accommodate button 5619. An opening such as opening 5623 may also be formed in one of regions 5621 (e.g., to form a speaker port). The end portions of housing 16 may also be provided with openings such as openings 5622 and 5624 for microphone and speaker ports and opening 5620 for an input-output data port. A similar configuration can be provided for the rear panel whether or not another display is used, i.e., the rear panel may be formed with a transparent member with an opaque coating.

In one embodiment, device 10 may also include one or more cameras. Cameras may be implemented, for example, by mounting camera modules within the housing of device 10. In one embodiment (as shown in FIG. 2A), device 10 may include front-facing camera 26. Front facing cameras may for example be mounted behind the front panel 5616 that covers display 7628. Alternatively or additionally (as shown in FIG. 2B), device may include rear-facing camera 28. Rear facing cameras may be mounted in device 10 behind the rear panel 7632 of device 10. In other suitable configurations, the housing of device 10 may be formed from a plastic or metal housing in which a transparent plastic or glass camera window structure has been mounted. In this type of arrangement, camera modules may be mounted behind the window structure.

The device may include a variety of I/O components including for example buttons, connectors, jacks, receivers, speakers and/or the like. Button 5619 may be used as a menu button. A user may press on button 5619 to navigate through screens that are displayed on display 7628 or to control other functions during the operation of device 10.

Button 5619 may be formed from any suitable material (e.g., plastic, glass, ceramic, metal, etc.). Particularly in arrangements in which button 5619 is surrounded by glass such as the glass in region 5621 of display 7628, it may be desirable to form button 5619 at least partly from glass. Using a glass layer to form the outermost surface of button 5619 makes it possible to match the appearance and feel of button 5619 to the appearance and feel of the display cover glass in region 5621. A glass surface layer on button 5619 may also help button 5619 resist scratching. Any suitable glass material may be used in forming button 5619 (e.g., soda lime glass, borosilicate glass, etc.). Glass-like plastic (e.g., transparent polycarbonate or other materials) may also be used to form button 5619 if desired.

Figure 3:
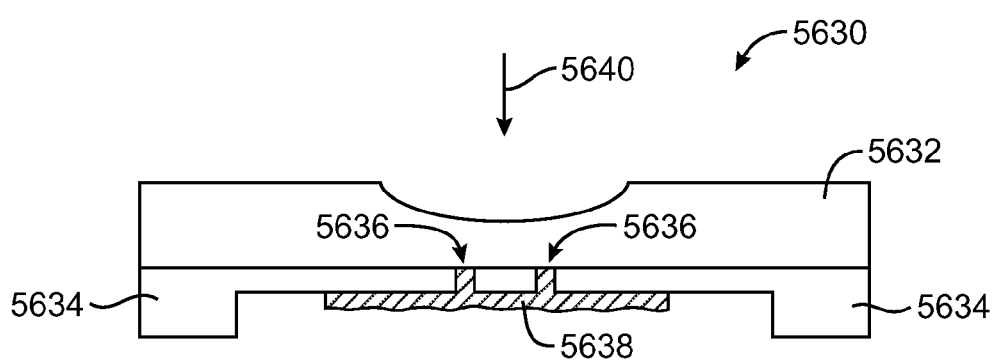
FIG. 3 is a cross-sectional side view of a conventional plastic cellular telephone button.

A cross-sectional side view of a conventional cellular telephone menu button is shown in FIG. 3. As shown in FIG. 3, conventional button 5630 may have a clear plastic upper button member 5632 that is attached to a black lower button member 5634. White ink 5638 may be formed on the backside of member 5634. Opening 5636 in button member 5634 may allow white ink 5638 to be viewed in direction 5640 (i.e., from the exterior of the cellular telephone). Opening 5636 is square when viewed from direction 5640.

Figure 4:
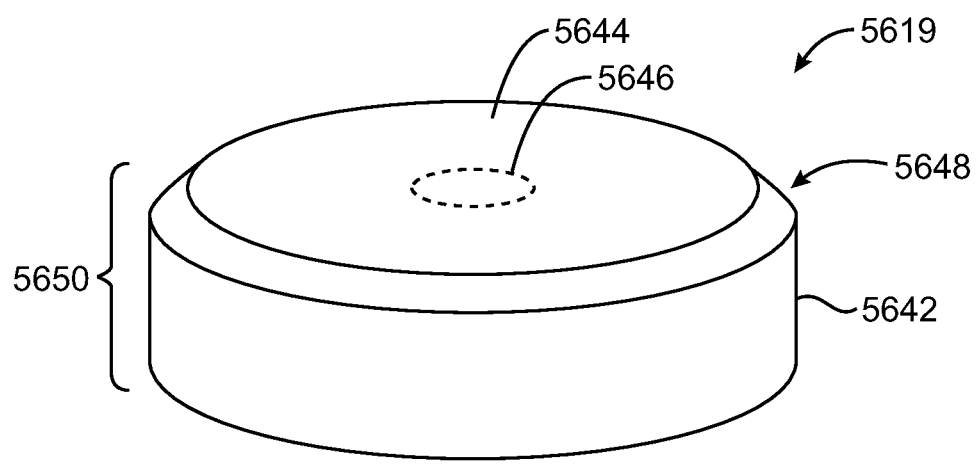
FIG. 4 is a perspective view of a glass button structure that may be used in a button in accordance with an embodiment of the present invention.

A button of the type that may be used to implement button 5619 for device 10 of FIG. 2 is shown in FIG. 4. As shown in FIG. 4, button 5619 may be formed from a glass button member such as button member 5650. Button member 5650 may have a circular outline or other suitable shape (e.g., rectangular, etc.). Button member 5650 may have a planar upper surface such as surface 5644 in which a recessed (concave) dimple such as dimple 5646 is formed. Button member 5650 may have sidewalls such as vertical sidewalls 5642. An optional chamfer such as chamfer 5648 may be provided around the outer edge of member 5650 to ensure that the edge of member 5650 at which surface 5644 meets sidewall 5642 is not too abrupt. Chamfer 5648 may be oriented at an angle of 45° or other suitable angle in the range of 30-60° with respect to vertical sidewall 5642.

Figure 5:
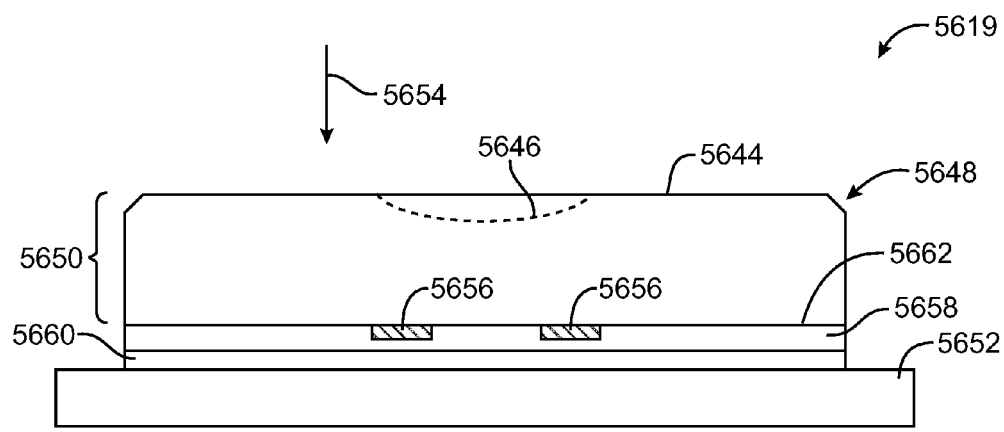
FIG. 5 is a cross-sectional side view of an illustrative button in accordance with an embodiment of the present invention.

As shown in FIG. 5, button 5619 may have a base member such as base member 5652 to which glass button member 5650 is attached. Glass button member 5650 may have the shape of a disk (e.g., a circular disk). Base member 5652 may have an outline that is larger than the outline of glass button member 5650. The central portion of base member 5652 may have a substantially circular shape to accommodate the outline of glass button member 5650. Side portions of base member 5652 may have protrusions that help orient button 5619 within device 10 (e.g., by fixing the rotational orientation of button 5619).

The underside (lower planar surface 5662) of button member 5650 may be provided with one or more patterned layers of material. For example, multiple coats of patterned ink may be formed on the lower surface of button member 5650. Layers of ink may be formed adjacent to one another (i.e., on different portions of lower surface 5662) and/or on top of each other).

In the example of FIG. 5, two layers of ink have been formed on lower surface 5662 of button member 5650. First ink layer 5656 may be formed directly on lower surface 5662. Second ink layer 5658 may be used to cover the portions of lower surface 5662 that are not covered by first ink layer 5656 and may be used to cover ink layer 5656. First ink layer 5656 may have a pattern such as a square (i.e., a square with an open center), a solid square, other solid shapes, a circular or oval ring, a letter or icon shape, etc. Second ink layer 5658 may be a solid background layer that covers substantially all of lower surface 5662.

When multiple layers of ink are formed on button member 5650 in this way, different ink colors may be used for each layer. For example, ink layer 5656 may be formed from a white ink or other lightly colored ink, whereas ink layer 5658 may be formed from a black ink or other darkly colored ink. Other combinations of colors may be used if desired. For example, first ink layer 5656 may be black or may have another dark color, whereas second ink layer 5658 may be white or may have another light color. By using contrasting colors in this way, the pattern that is formed by first ink layer 5656 may be visible against solid background layer 5658.

If desired, first and second patterned materials 5656 and 5658 may be formed from metal, plastic, fibers, particles, paint, combinations of these substances, and other suitable substances. The use of ink for the layers of patterned material that are formed on the underside of button member 5650 is merely illustrative.

Member 5650 may be formed from clear (transparent) glass. This allows a user of device 10 to view the pattern formed by ink 5656 through member 5650 when observing button 5619 in direction 5654. If desired, member 5650 may be formed from a semi-opaque or opaque substance (e.g., frosted glass, smoked or colored glass, black glass, etc.). When member 5650 is at least partly transparent, the pattern of ink 5656 may be viewed. When member 5650 is opaque, ink layers 5656 and 5658 may be omitted (if desired).

Member 5650 may be attached to one or more underlying structures. For example, member 5650 may be attached to base layer 5652 using adhesive layer 5660. Adhesive 5660 may be, for example, a layer of pressure sensitive adhesive or an adhesive such as ultraviolet-cured or thermally cured epoxy. Other adhesives or attachments mechanisms (e.g., press-fit schemes, springs, clips, etc.) may also be used in attaching button member 5650 to base members such as base member 5652 if desired.

Figure 6:
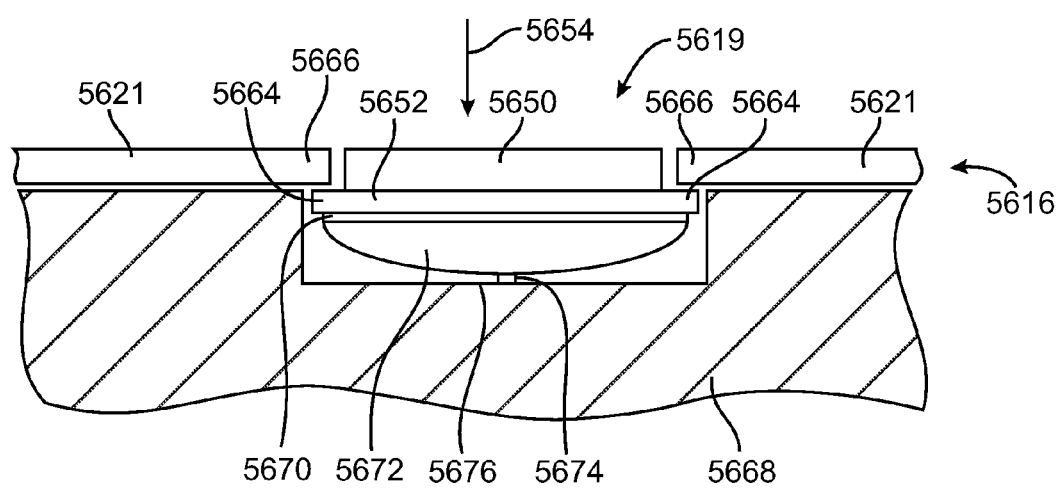
FIG. 6 is a cross-sectional side view of an illustrative button mounted within a portion of an electronic device in accordance with an embodiment of the present invention.

A cross-sectional view of button 5619 in electronic device 10 of FIG. 2 is shown in FIG. 6. As shown in FIG. 6, base member 5652 may have portions 5664 that extend under protruding edge portions 5666 of display cover glass 5621. Edge portions 5666 capture button 5619 and prevent button 5619 from falling out of device 10. Portions 5664 and portions 5666 may extend around the entire circular periphery of button member 5650 or may be formed around only part of the button periphery. An asymmetric shape may be used for portions 5664 and a mating asymmetric shape may be used by the surrounding structures in device 10 to ensure that button 5619 can only be placed in device 10 in a particular orientation. Base 5652 may, for example, have one narrow protruding portion 5664 and one wide protruding portion 5666, that mate with corresponding structures in device 10, such as structures 5668.

Structures 5668 may be formed from one or more internal members in device 10, such as frame members, display portions, printed circuit boards, flexible printed circuits boards ("flex circuits"), electrical components, or other suitable structures. These structures are shown as structure 5668 in the example of FIG. 6.

A dome switch such as switch 5672 or other switch mechanism may be coupled to button 5619. Dome switch 5672 may be placed in an upright orientation, or, as shown in FIG. 6, may be inverted so that nub 5674 bears downwards against surface 5676 of structure 5668. A flex circuit such as flex circuit 5670 may contain conductive traces that form switch terminals for dome switch 5672. The inner surface of the dome membrane portion of dome switch 5672 may be coated with metal. When button member 5650 is pressed downwards in direction 5654, dome switch 5672 is compressed between button member 5650 and interior device structures 5668. This causes the metal inner surface of the dome switch to form a short circuit between the dome switch terminals, thereby closing the switch. Conductive traces in flex circuit 5670 may route switch signals to processing circuitry in device 10. The processing circuitry can monitor the state of the switch using the conductive traces. When the processing circuitry senses that the state of the dome switch has changed, appropriate actions may be taken. For example, different information may be displayed on screen 7628, functions can be turned on or off, etc.

Figure 7:
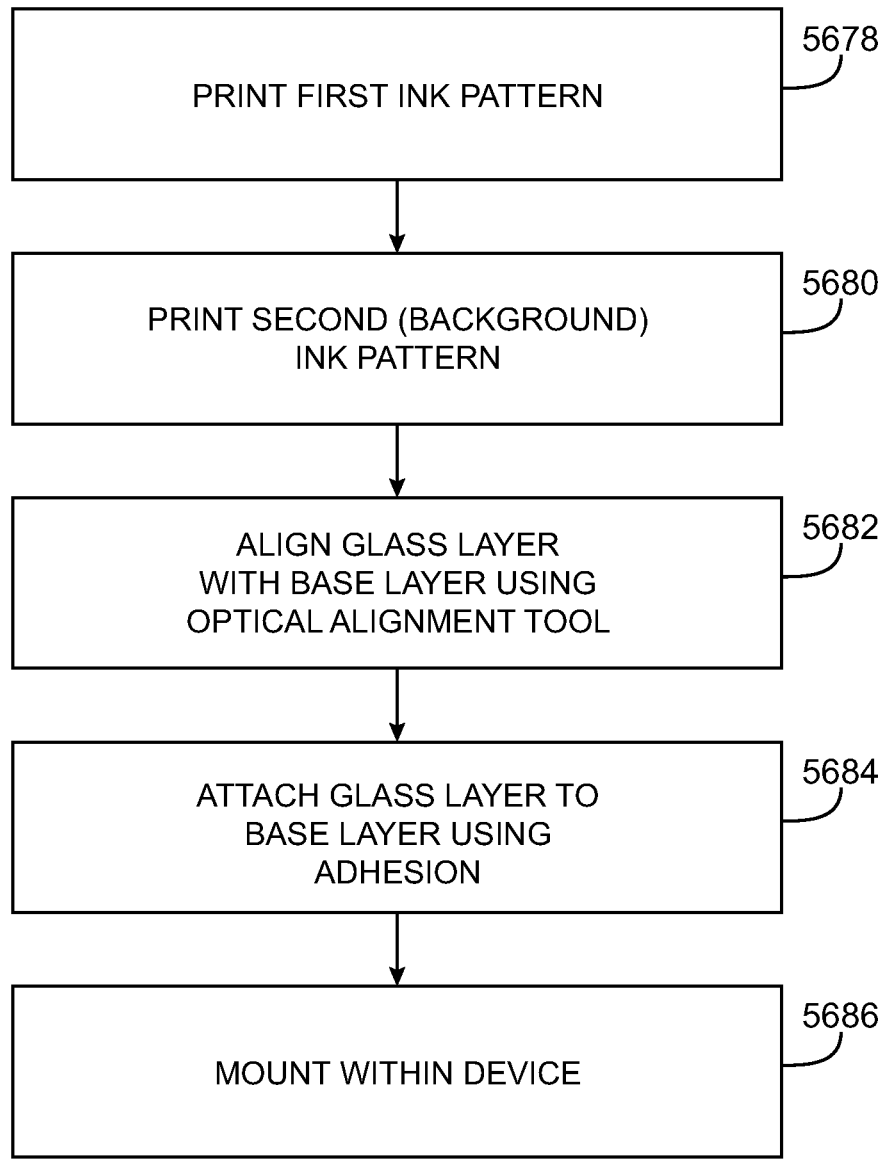
FIG. 7 is a flow chart of illustrative steps involved in forming a button in accordance with an embodiment of the present invention.

Illustrative steps involved in forming a button such as button 5619 are shown in FIG. 7.

At step 5678, a first layer of patterned ink such as patterned ink 5656 of FIG. 5 may be formed on the lower surface of button member 5650. Any suitable technique may be used to form the first ink layer. For example, the ink layer may be formed by pad printing, screen printing, dripping, spraying, brush painting, etc.

At step 5680, the second layer of ink may be formed on the lower surface of button member 5650. For example, a patterned layer or a blanket background layer such as layer 5658 of FIG. 5 may be formed over substantially all of the underside of button member 5650, including first ink layer 5656 and any other previously deposited ink patterns.

Ink layers 5656 and 5658 may be formed from inks of different colors (shades), paint of different colors, plastics, metals, or other materials with different optical properties, etc.

At step 5682, an optical alignment tool may be used to visually align button member 5650 and base layer 5652. For example, a visual image of button member 5650 and base layer 5652 may be captured using a digital camera. The visual image may be processed using a computer or may be examined manually while the angular and translational orientation of button member 5650 relative to base layer 5652 are adjusted using manually and/or automatically controlled rotation and translation stages.

Once aligned, button member 5650 may be attached to base layer 5652 to form button 5619 using a layer of pressure sensitive adhesive at step 5684 (e.g., by pressing these structures together using an assembly tool or moving portions of the alignment tool).

At step 5686, button member 5650, base layer 5652, and dome switch 5672 may be assembled within device 10, as described in connection with FIG. 6.

Electronic devices such as cellular telephones often contain components such as vibrators, switches, microphones, and audio jacks. Because of size and performance constraints, it can be challenging to mount these components within the confines of a device housing. If care is not taken, it may not be possible to use desired materials or to provide desired levels of performance within a device housing of a given size. In conventional device arrangements, components are sometimes constructed in a way that compromises performance or that uses more space than necessary. While such conventional arrangements can be used to produce an operational device, the compromises that are made in using these arrangements can result in devices with poor aesthetics, suboptimal performance, and unnecessary device bulk.

It would therefore be desirable to be able to provide improved electronic device components and mounting arrangements for these components.

In accordance with one embodiment, an electronic device may be provided with a housing having housing sidewalls. A housing structure such as a plate may be connected to the housing sidewalls. Ports such as ports for an audio jack and a microphone may be formed in the housing sidewalls.

An audio jack may be mounted to the housing plate adjacent to the audio jack port. A microphone may be mounted between the audio jack and the housing sidewall. A biasing structure such as a layer of compressed foam may be interposed between the audio jack and the microphone to bias the microphone against the housing sidewall in the vicinity of the microphone port.

A vibrator may be mounted between one of the sidewalls and the audio jack using a bracket. The vibrator may have a weight that is tapered along its length.

A button may be formed in a button opening in one of the housing sidewalls. The button may have a button member with a protrusion that extends through the button opening in the sidewall. A support structure may be interposed between a switch and the button member. The switch may have a portion that extends through an opening in the support structure. This portion of the switch may be received within the button member, so that the switch can be actuated by moving the button member within the button opening. A lubricating coating may be formed between the button member and the housing sidewall.

In accordance with an embodiment, an apparatus is provided that includes an electronic device housing structure having an opening, a button member having a protrusion that protrudes through the opening, wherein the electronic device housing structure has a first wall portion that lies above the button member and a second wall portion, and a lubricating coating interposed between the button member and the second wall portion, wherein the first wall portion has a thickness that is smaller than the second wall portion.

In accordance with another embodiment, an apparatus is provided wherein the button member includes metal and wherein the electronic device housing structure includes a metal electronic device housing wall through which the opening is formed.

In accordance with another embodiment, an apparatus is provided that also includes a visual indicator on the button member, wherein the button member is movable between a first position in which the visual indicator is visible through the opening and a second position in which the visual indicator is covered by the first wall portion without touching the first wall portion.

In accordance with another embodiment, an apparatus is provided wherein the visual indicator includes a patch of ink.

In accordance with an embodiment, an electronic device is provided that includes housing structures, an audio jack mounted in the housing structures, and a microphone interposed between the audio jack and the housing structures.

In accordance with another embodiment, an electronic device is provided wherein the housing structures include a housing wall with a microphone port opening, the electronic device further including a layer of compressed foam interposed between the microphone and the audio jack, wherein the layer of compressed foam biases the microphone toward the housing wall at the microphone port opening.

In accordance with another embodiment, an electronic device is provided that also includes a vibrator mounted to the audio jack.

In accordance with another embodiment, an electronic device is provided that also includes at least one bracket with which the vibrator is mounted to the audio jack.

In accordance with another embodiment, an electronic device is provided wherein the vibrator includes a tapered weight.

In accordance with another embodiment, an electronic device is provided wherein the vibrator includes a shaft to which the tapered weight is attached, wherein the shaft has a tip, wherein the tapered weight has a surface that is radially closer to the shaft at the tip than at other portions of the shaft.

In accordance with another embodiment, an electronic device is provided wherein at least part of the tapered weight has a conical surface.

In accordance with another embodiment, an electronic device is provided wherein the tapered weight has multiple sections each of which has a cylindrical surface having a different radial distance from the shaft.

In accordance with an embodiment, an apparatus is provided that includes a vibrator motor for a vibrator, a shaft for the vibrator that is rotated by the vibrator motor, wherein the shaft has a rotational axis, and a weight for the vibrator that is rotationally asymmetric and that is tapered along the rotational axis.

In accordance with another embodiment, an apparatus is provided that also includes electronic device housing structures, and a member with which the vibrator motor is mounted to the electronic device housing structures.

In accordance with another embodiment, an apparatus is provided wherein the electronic device housing structures include a housing wall to which the member is attached, the apparatus also including an audio jack to which the member is attached.

In accordance with another embodiment, an apparatus is provided also including a microphone interposed between the audio jack and the housing wall.

In accordance with another embodiment, an apparatus is provided that also includes a layer of compressed foam interposed between the microphone and the audio jack, wherein the layer of compressed foam biases the microphone toward the housing wall at a microphone port opening in the housing wall.

In accordance with another embodiment, an apparatus is provided wherein the shaft has a tip, wherein the tapered weight has a surface that is radially closer to the shaft at the tip than at other portions of the shaft.

In accordance with another embodiment, an apparatus is provided wherein at least part of the tapered weight has a conical surface.

In accordance with another embodiment, an apparatus is provided wherein the tapered weight has multiple sections each of which has a cylindrical surface having a different radial distance from the shaft.

In accordance with an embodiment, an apparatus is provided that includes an electronic device housing wall having an opening, a button member that has a protrusion that protrudes through the opening, a switch that is actuated by the button member, and a support structure to which the switch is mounted, wherein the support structure is interposed between the switch and the button member.

In accordance with another embodiment, an apparatus is provided wherein the support structure has an opening and wherein the switch has a portion that extends through the opening in the support structure and that is actuated by the button member.

In accordance with another embodiment, an apparatus is provided wherein the support structure includes a bracket that is connected to the housing wall.

In accordance with another embodiment, an apparatus is provided that also includes a flexible printed circuit, wherein the flexible printed circuit is interposed between the switch and the bracket.

In accordance with another embodiment, an apparatus is provided wherein the button member and the housing sidewall are formed from metal and wherein the apparatus further includes a lubricating coating interposed between the button member and the housing sidewall.

In accordance with these embodiments, electronic devices contain numerous components. Examples of components that are included in electronic devices include buttons, audio jacks, vibrators, and microphones. Buttons are used as user input devices. Examples of functions that may be controlled using a button include power functions, ring/vibrator settings for a cellular telephone, volume settings, menu button operation, etc. Audio jacks can be used to receive mating plugs from external accessories. For example, an audio jack may have a cylindrical opening that receives an audio plug on a headset. Vibrators may be used to provide haptic feedback on a touch screen, to alert a user to an incoming cellular telephone call, to indicate the presence of an alarm, etc. Microphones may be used to gather audio input. For example, microphones may be used to record voice memos or to capture other audio clips, to gather ambient noise information in an electronic device that has noise cancellation functions, to monitor a user's voice during a telephone call, etc.

Components such as these may be used in cellular telephones and other electronic devices. For example, components such as these may be used in electronic devices such as cameras, handheld computers, tablet computers, computers integrated into computer monitor housings, laptop computers, set-top boxes, gaming devices, wrist watch devices, pendant devices, etc. With one suitable configuration, the components may be part of relatively compact electronic devices such as portable electronic devices.

Figure 8:
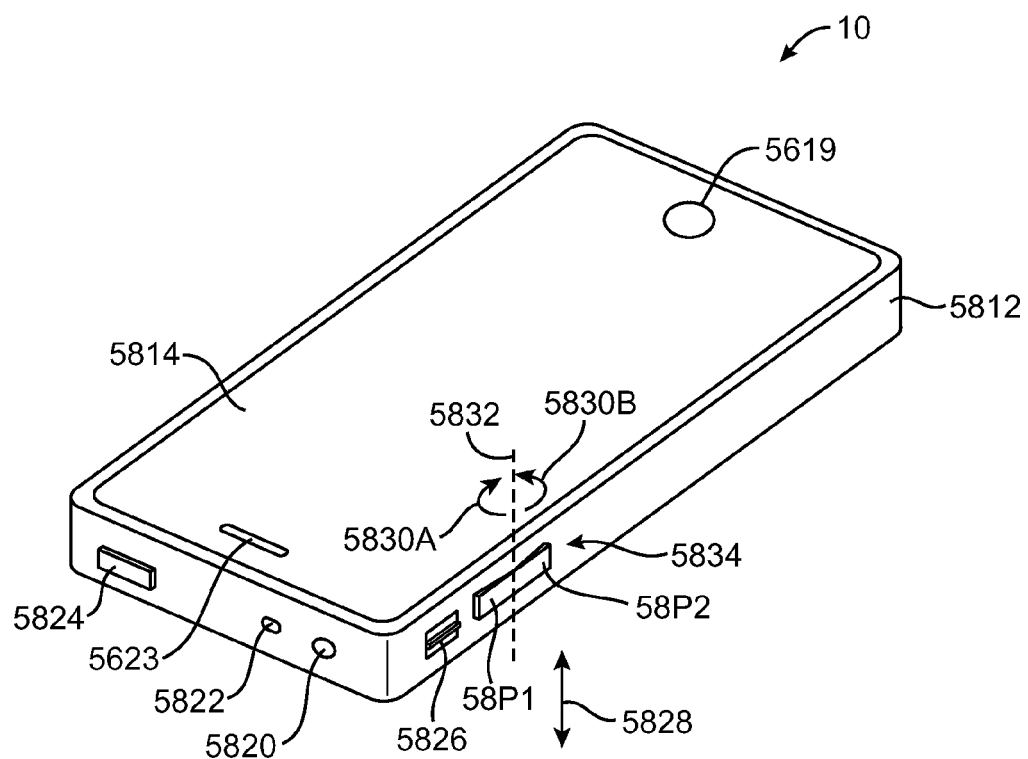
FIG. 8 is a perspective view of an illustrative electronic device in accordance with an embodiment of the present invention.

One embodiment of device 10 is shown in FIG. 8. As shown in FIG. 8, portable electronic device 10 may include a device housing such as device housing 5812. Display 5814 may be mounted to the front face of housing 5812.

Openings in the cover glass layer 5616 may be provided for button 5619 and speaker port 5623. Openings in housing sidewall 5812 may be provided for microphones, speakers, input-output connectors, etc. As shown in FIG. 8, for example, housing 5812 may have a circular opening that forms audio jack port 5820 and an opening such as opening 5822 that forms a microphone port.

The buttons in device 10 may be push buttons, toggling switches, momentary sliding buttons, rocker switches, or any other suitable types of buttons. As an example, buttons 5619 and 5824 may be momentary push buttons. Button 5826 may be, as an example, a two-position button that toggles in directions 5828. In a first of its two positions, button 5826 may be closed. In a second of its two positions, button 5826 may be open. If desired, buttons of this type may be provided with three or more positions or may be implemented using a momentary switch design. Button 5834 may be, for example, a rocker switch. A user may press on portion 58P1 or portion 58P2 on the surface of button 5834. When the user presses portion 58P1, button 5834 rotates around axis 5832 in direction 5830A and actuates a first switch. When the user presses portion 58P2, button 5834 rotates around axis 5832 in direction 5830B and actuates a second switch. Button 5834 may, if desired, be a momentary button (i.e., a button that is spring-loaded to return to its nominal position in the absence of user input).

Any suitable functions may be controlled by the buttons of device 10. For example, button 5619 may serve as a menu button. Button 5824 may serve as a power (sleep) button. Button 5826 may serve as a cellular telephone ring mode button (e.g., toggling between a vibrate mode and a ring mode). Button 5834 may be used to adjust ring volume and speaker volume settings. Other arrangements may be used if desired. These illustrative button assignments are merely examples.

Figure 9:
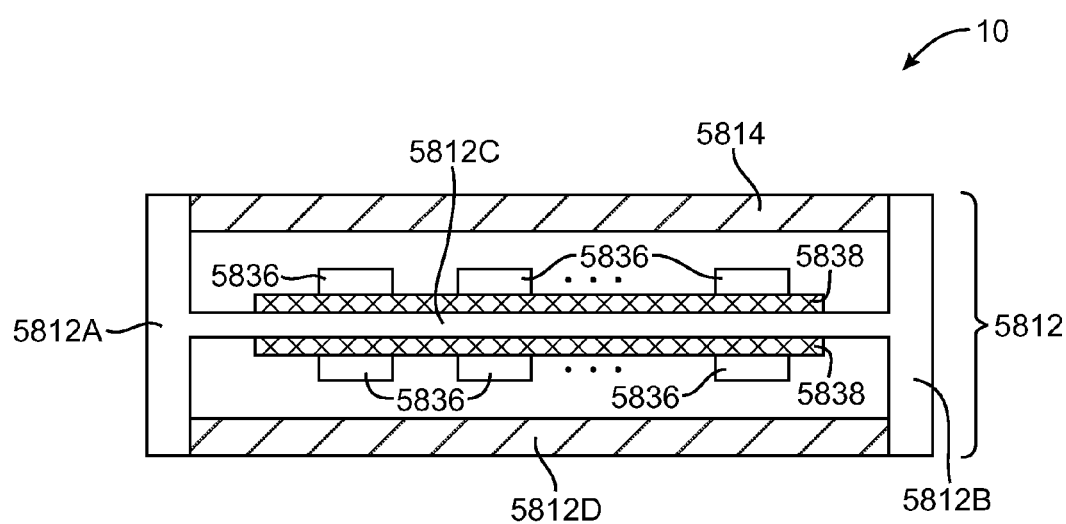
FIG. 9 is a cross-sectional end view of an illustrative electronic device of the type shown in FIG. 8 in accordance with an embodiment of the present invention.

A cross-sectional side view of device 10 of FIG. 8 is shown in FIG. 9. As shown in FIG. 9, housing 5812 may include sidewall structures such as housing sidewall structures 5812A and 5812B. Housing 5812 may, for example, have upper, lower, left, and right sidewalls (i.e., four peripheral sidewalls associated with the four edges that run along the periphery of a rectangular housing). In this type of arrangement, the housing sidewalls can be formed from a band-shaped peripheral member that surrounds device 10. Housing sidewall structure 5812A may correspond to a left-hand sidewall and housing sidewall structure 5812B may correspond to a right-hand sidewall. Housing member 5812C, which may be implemented using a plate or other hinge structure, may be used to connect and support sidewall structures 5812A and 5812B. Plate 5812C may be formed from a planar metal member having a left edge welded or otherwise attached to left sidewall 5812A and a right edge welded or otherwise attached to right sidewall 5812B. There may be one or more structures such as plate 5812C in device 10.

As shown in FIG. 9, the front surface of device 10 may be occupied by display 5814. Display 5814 may be formed using a touch screen display or other suitable display. Display 5814 may be mounted to housing 5812 using gaskets, plastic frame members, or other suitable attachment mechanism. The rear surface of device 10 may be occupied by housing layer 5812D. Layer 5812D may be formed from metal, glass, ceramic, composites, plastic, other materials, or combinations of these materials. As an example, layer 5812D may be formed from a planar glass layer. If desired, layer 5812D may be formed from part of a display (e.g., a cover glass for a rear-facing display that complements display 5814 on the front surface of device 10). Passive arrangements in which layer 5812D is formed from a piece of plastic or glass may also be used. Layer 5812D may be formed from a separate layer of material that has been attached to the sidewalls of housing 5812 or may be formed as an integral portion of housing 5812 (e.g., as a unibody housing in which the housing sidewalls have been formed from the same piece of material as layer 5812D).

Components such as components 5836 may be mounted to printed circuit boards such as printed circuit boards 5838. Printed circuit boards 5838 may be mounted to housing structure 5812D as shown in FIG. 9 or may be mounted within the housing of device 10 using other suitable arrangements. There are two printed circuit boards 5838 in the example of FIG. 9. This is merely illustrative. Any suitable number of components 5836 may be mounted within device 10 using any suitable number of printed circuit boards 5838. Printed circuit boards 5838 may be formed from rigid printed circuit board substrates (e.g., rigid substrates of epoxy or fiberglass-filled epoxy), flexible printed circuits (e.g., flex circuits formed from thin layers of polymer such as sheets of polyimide), or other suitable substrates.

Figure 10:
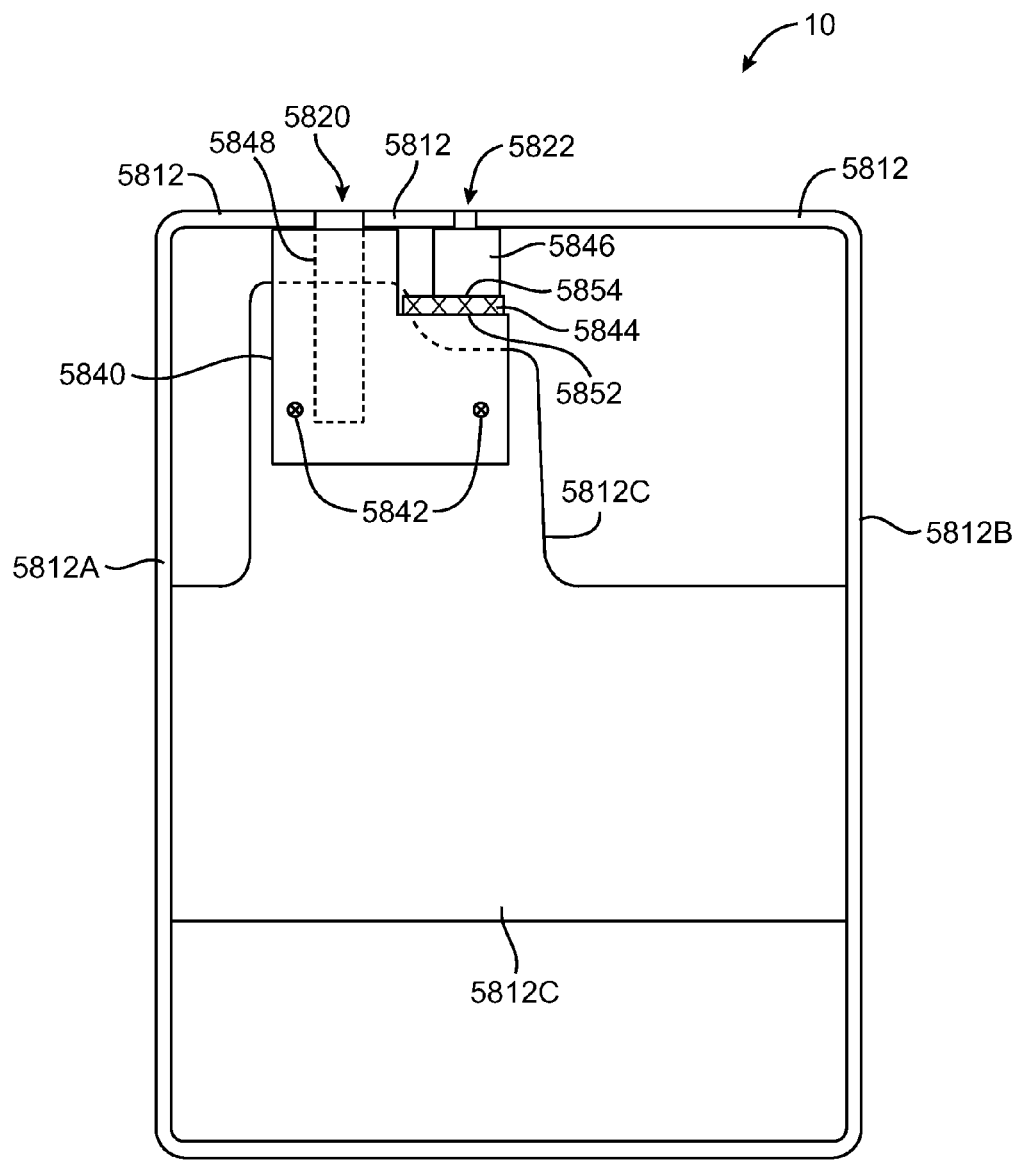
FIG. 10 is a top interior view of an electronic device in accordance with an embodiment of the present invention.

A top (front) view of the interior of device 10 is shown in FIG. 10. As shown in FIG. 10, device 10 may have an audio jack such as audio jack 5840. Audio jack 5840 may be attached to housing member 5812C using screws 5842 or other fastening mechanisms (e.g., adhesive, welds, solder, etc.). Audio jack 5840 may include a cylindrical cavity such as cavity 5848. Cavity 5848 may have a circular opening that is aligned with a circular opening in housing 5812 (i.e., the opening in housing 5812 that forms audio jack port 5820 of FIG. 8). The housing of audio jack 5840 may be formed from plastic, metal, or other suitable materials.

Device 10 may have an opening such as opening 5822 that forms microphone port. Opening 5822 may be covered with layers of screen material (e.g., an outer layer of metal mesh and an inner layer of plastic mesh). Microphone 5846 may be mounted at opening 5822. Microphone 5846, which is sometimes referred to as a microphone unit or microphone module, may be a microelectromechanical systems (MEMS) microphone that is housed in a plastic or metal housing (as an example). The microphone housing may have an opening that is aligned with opening 5822 in housing 5812. A biasing member such as foam pad layer 5844 may be mounted between surface 5852 of audio jack 5840 and surface 5854 of microphone 5846. Foam pad layer 5844 may be compressed. As a result, foam pad layer 5844 may generate a restoring force that biases microphone 5846 against opening 5822 in housing 5812. This creates a seal around opening 5822 and ensures that foreign objects do not intrude into the interior of device 10.

With an arrangement of the type shown in FIG. 10, the housing of audio jack 5840 is used in mounting microphone 5846 in device 10. If desired, other components may be mounted in device 10 using audio jack 5840 (e.g., speaker modules, additional microphone modules, input-output connectors, circuit assemblies, sensors, batteries, etc.). The use of audio jack 5840 to mount microphone 5846 is merely an example.

Figure 11:
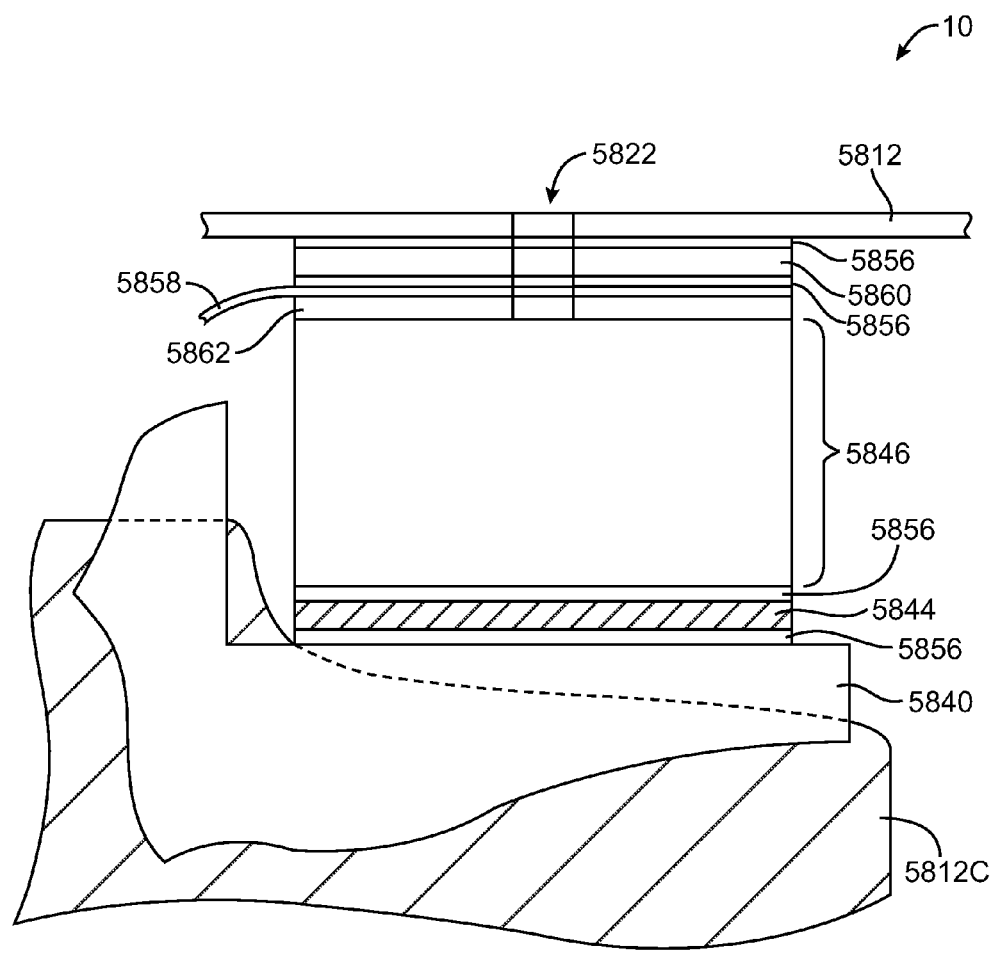
FIG. 11 is a top view of an interior portion of an electronic device showing how a microphone may be mounted using an audio jack in accordance with an embodiment of the present invention.

A more detailed view showing how microphone 5846 may be mounted using audio jack 5840 is shown in FIG. 11. As shown in FIG. 11, microphone 5846 may be biased against housing 5812 using compressed foam layer 5844. Foam layer 5860 may be interposed between microphone 5846 and housing 5812 to provide sealing between microphone 5846 and housing 5812. Microphone 5846 may have an associated printed circuit board such as printed circuit board 5862. Circuitry on printed circuit board 5862 may be used in processing microphone signals. A communications path such as a bus formed from conductive traces on flexible printed circuit ("flex circuit") 5858 may be used to route signals from microphone 5846 to circuitry on one of printed circuit boards 5838 (FIG. 9). Layers of adhesive 5856 may be used in attaching housing 5812, foam 5860, flex circuit 5858, printed circuit board 5862, the housing for microphone 5846, foam 5844, and audio jack 5840.

Figure 12:
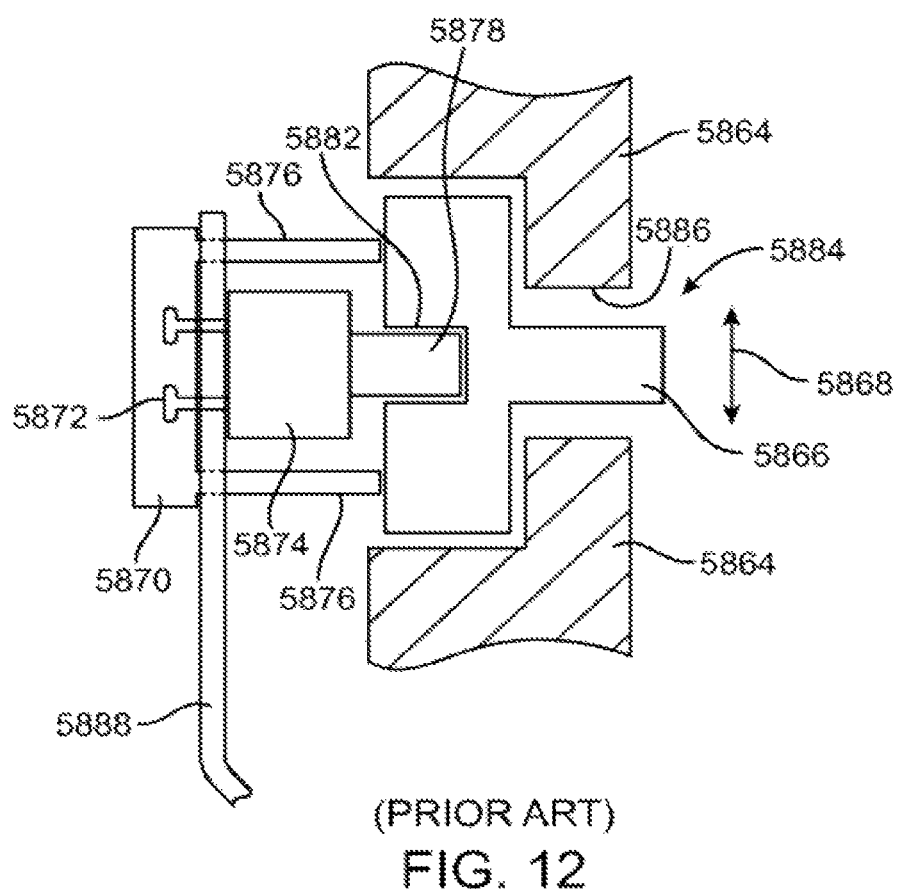
FIG. 12 is a cross-sectional view of a conventional button in a cellular telephone.

A cross-sectional side view of a conventional button in a cellular telephone is shown in FIG. 12. As shown in FIG. 12, button 5884 has button member 5866. Button member 5866 is formed from metal and protrudes through opening 5886 in plastic housing sidewall 5864. Switch 5874 has protrusion 5878. Protrusion 5878 is received in recess 5882 of button member 5866. A user can move button member 5866 back and forth in directions 5868 to turn switch 5874 on or off. As the user moves button member 5866, button member 5866 engages switch protrusion 5878 and actuates switch 5874.

Switch 5874 is mounted to bracket 5870 using heat stakes 5872. Flex circuit 5888 has traces that are electrically connected to the switch terminals of switch 5874. Bracket 5870 is connected to housing 5864, so that bracket 5870 does not move during operation of switch 5874. Bracket extensions 5876 help prevent button member 5866 from pressing excessively against switch 5874. Nevertheless, the user activity that is involved in operating button 5884 may impart inward force on member 5866 that can undesirably load and potentially damage switch 5874.

Figure 13:
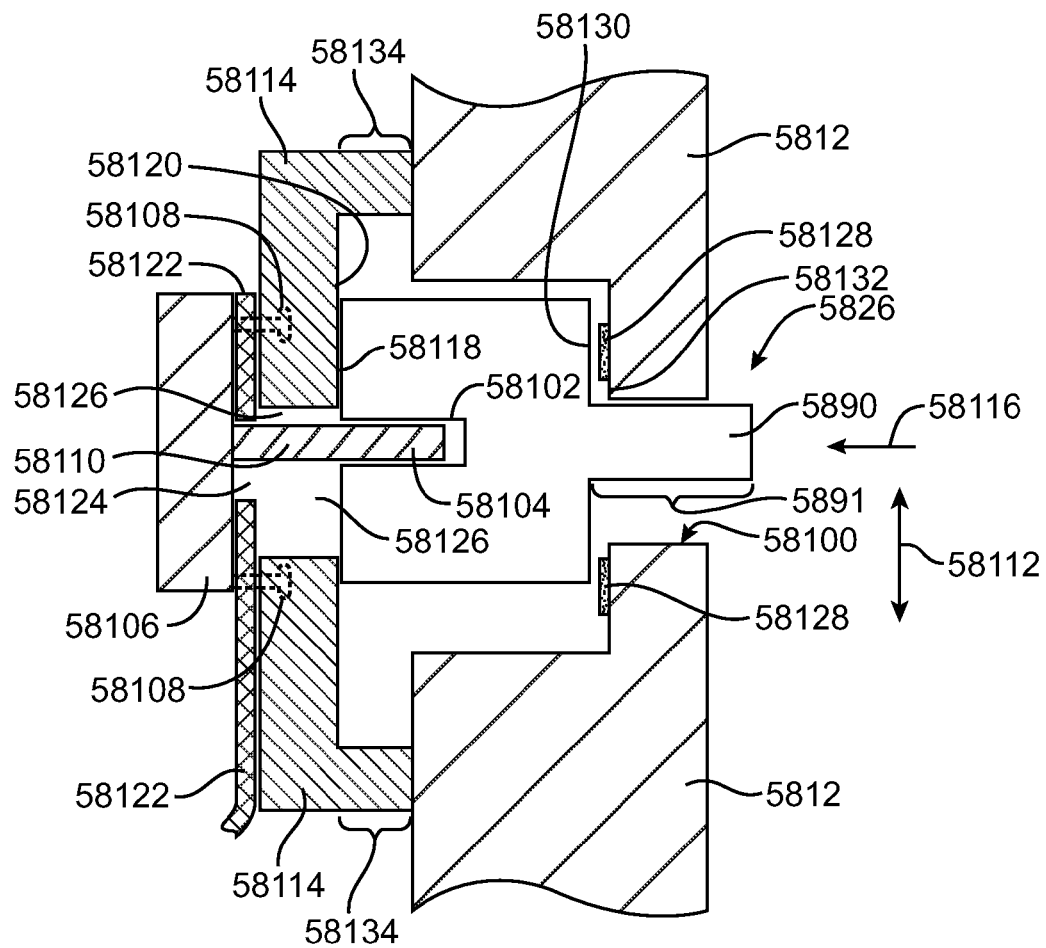
FIG. 13 is a cross-sectional view of a button assembly in an electronic device in accordance with an embodiment of the present invention.

A button such as button 5826 of device 10 of FIG. 8 is shown in the cross-sectional view of FIG. 13. As shown in FIG. 13, button 5826 may have a button member such as button member 5890. Button member 5890 may have a protruding portion such as portion 5891 that extends through opening 58100 in housing wall 5812. Button member 5890 may have a recess such as recess 58102 that receives a corresponding protruding switch member such as switch member 58104. When button member 5890 is moved back and forth in directions 58112, switch member 58104 is likewise moved back and forth in directions 58112, thereby actuating switch 58106.

A support structure such as bracket 58114 may be interposed between the main body of switch 58106 and button member 5890. Switch 58106 may be mounted to bracket 58114 using heat stakes 58108 on switch 58106. With this arrangement, inward pressure on button member 5890 in direction 58116 will cause inner surface 58118 of button member 5890 to press against outermost surface 58120 of bracket 58114, but will not load switch 58106.

Bracket 58114 may be connected to housing 5812 using portions 58134, using bracket structures of other shapes, or using intermediate structures (i.e., structures that are connected between bracket 58114 and housing 5812). Bracket 58114 may be formed from metal and may be attached to housing 5812 using welds. If desired, other mechanisms may also be used to attach bracket 58114 and housing 5812 such as solder, screws or other fasteners, adhesive, etc.

Because surface 58118 bears against surface 58120, the presence of bracket 58114 adjacent to button member 5890 can help protect switch member 58104 and the rest of switch 58106 from undesirable inward forces in direction 58116 when a user operates button member 5890. Switch 58106 may be electrically connected to traces in flex circuit 58122. Flex circuit 58122 may have one end that is electrically connected to switch 58106 and another end that is electrically connected to one of printed circuit boards 5838 (as an example). To accommodate the movement of protruding switch member 58104 in directions 58112, flex circuit 58122 may be provided with opening 58124 and bracket 58114 may be provided with opening 58126.

Button member 5890 and housing 5812 may be formed from metal or other suitable materials. If desired, a lubricating coating such as lubricating coating 58128 may be formed between button member surface 58130 and housing surface 58132. Coating 58128 may be formed from polytetrafluoroethylene or other fluorocarbon materials, graphite, grease, polyurethane, or other slippery coatings. The presence of coatings such as coating 58128 may help prevent binding between the metal surfaces of button member 5890 and housing 5812 during operation of button 5826. If desired, portions of housing 5812 over surface 58130 may be recessed (see, e.g., FIG. 12).

It may be desirable to provide device 10 with vibrator functionality. A vibrator may be used to vibrate housing 5812 and device 10 when an incoming cellular telephone call is received, when an alarm is triggered, as part of a haptic feedback arrangement for a touch screen, etc.

Figure 14:
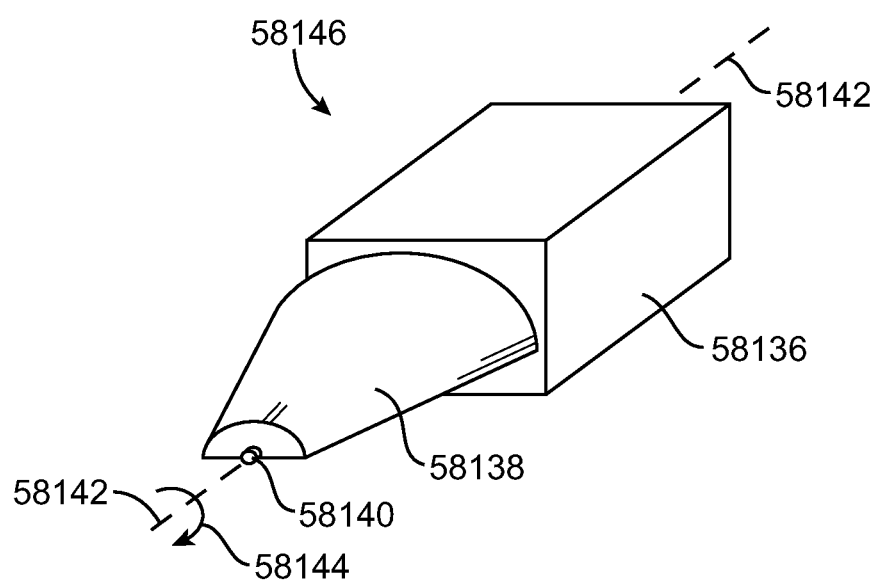
FIG. 14 is a perspective view of an illustrative electronic device vibrator having a tapered weight having a conical surface in accordance with an embodiment of the present invention.

An illustrative vibrator that may be used in device 10 is shown in FIG. 14. As shown in FIG. 14, vibrator 58146 may have a main body such as body 58136. Weight 58138 may be mounted to shaft 58140. Weight 58138 may be formed from metal or other suitable materials. Body 58136 may contain a motor that rotates shaft 58140 and thereby causes weight 58138 to rotate in direction 58144 about rotational axis 58142 of shaft 58140. The mass of weight 58138 is asymmetrically distributed about shaft 58140 and rotational axis 58142, so that when weight 58138 rotates, vibrator motor housing 58136 and the housing of device 10 in which vibrator 58146 is mounted vibrate.

Weight 58138 may have a tapered shape along length of rotational axis 58142. At the end of shaft 58140 that is adjacent to motor 58136, weight 58138 may have a relatively larger shape (i.e., the radial distance to the outer portions and surface of weight 58138 may be relatively large). At the far end of shaft 58140, away from motor 58136, weight 58138 may have a relatively smaller shape (i.e., the radial distance to the outer portions and surface of weight 58138 may be relatively small). This type of arrangement in which the radial distance from the shaft to the surface of the weight diminishes with increasing distance along the shaft, allows components and housing structures in device 10 to be mounted in the open space near the tapered end portion of weight 58138.

Figure 15:
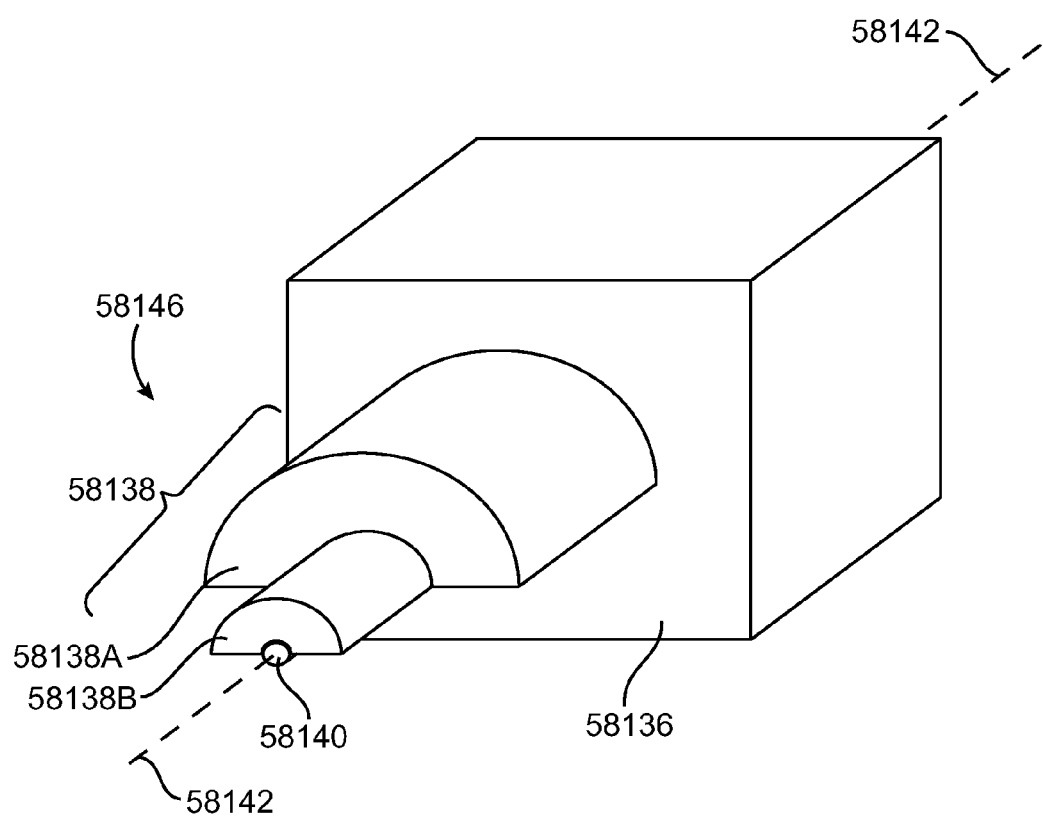
FIG. 15 is a perspective view of an illustrative electronic device vibrator having a tapered weight formed from cylindrical sections of different sizes in accordance with an embodiment of the present invention.

If desired, weight 58138 may have a segmented structure as shown in FIG. 15. With this type of arrangement, the taper in the weight is achieved by using a larger weight structure such as weight structure 58138A in the vicinity of motor housing 58136 and using a smaller weight structure such as weight structure 58138B at the tip of shaft 58140. In this example, tapered weight 58138 is formed from two half cylinders. If desired, more half cylinders (e.g., three or more) or other rotationally asymmetric weight structures of different sizes may be used.

Figure 16:
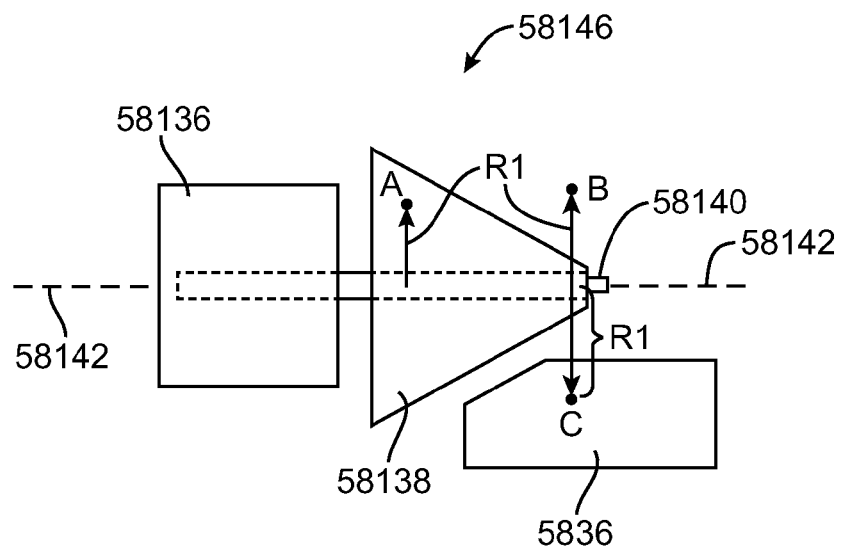
FIG. 16 is a top view of an illustrative electronic device vibrator with a conical tapered weight in accordance with an embodiment of the present invention showing how the tapered shape of the weight allows for additional components to be mounted in the vicinity of the vibrator.
Figure 17:
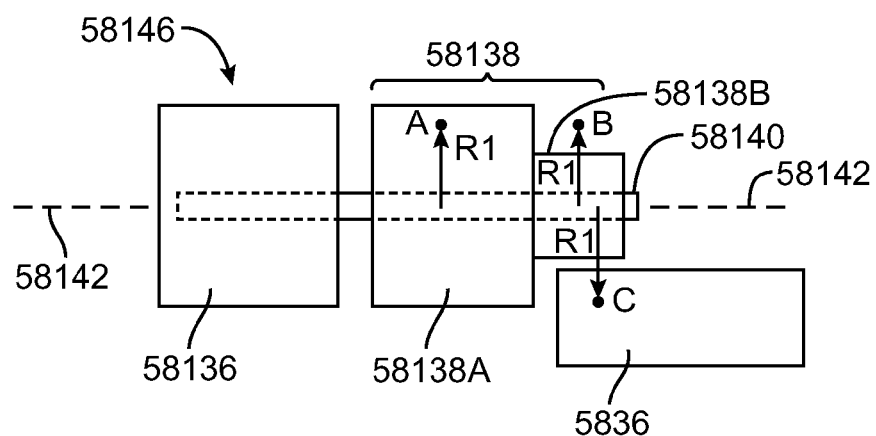
FIG. 17 is a top view of an illustrative electronic device vibrator having a tapered weight formed from cylindrical sections of different sizes in accordance with an embodiment of the present invention.

Top views of illustrative tapered-weight configurations that may be used for vibrator 58146 are shown in FIGS. 16 and 17. As shown in FIG. 16, tapered weight 58138 has a larger size near motor 58136 than near the exposed tip of shaft 58140. At a given radial distance from shaft 58140 such as radius R1, portions of weight 58138 are present at point A (near the motor), but are absent at point B (near the tip of shaft 58140). This makes is possible to mount component 5836 within radius R1 of shaft 58140 near the tip of shaft 58140 (i.e., at point C). Similarly, the two-radius weight arrangement of FIG. 17 allows component 5836 to be mounted within radius R1 of shaft 58140 near the tip of shaft 58140 (i.e., at point C).

Figure 18:
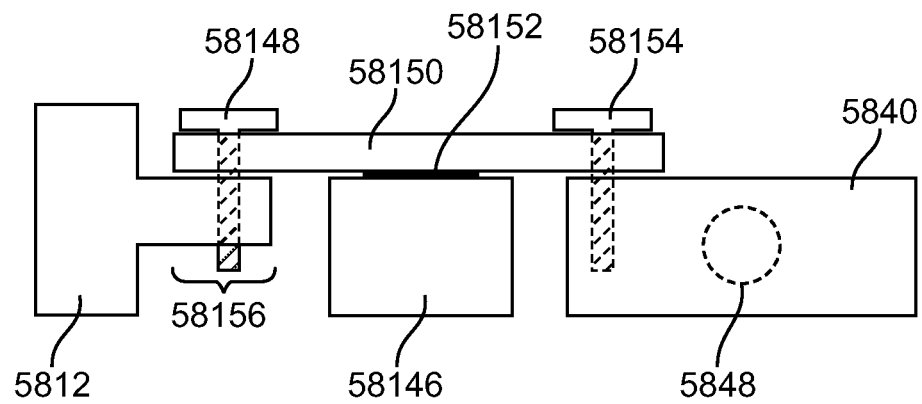
FIG. 18 is a side view showing how a vibrator may be mounted between an electronic device housing structure and an audio jack in accordance with an embodiment of the present invention.

FIG. 18 shows how vibrator 58146 may be mounted to a member such as bracket 58150. Bracket 58150 may be mounted to housing 5812 using screw 58148. Bracket 58150 may be mounted to audio jack 5840 using screw 58154. Housing 5812 may be provided with a threaded boss or other portion such as portion 58156 to receive threaded screw 58148. Portion 58156 may be formed as an integral part of housing 5812 or may be formed from a bracket or other structure that is attached to housing 5812. Audio jack 5840 may be provided with a threaded bore that receives the threads of screw 58154. If desired, bracket 58150 and vibrator 58146 may be mounted to housing structure 5812 and audio jack 5840 using other attachment mechanisms (e.g., welds, solder, adhesive, other fasteners, brackets, clips, springs, foam, press-fit members, etc.). The use of fasteners such as screws 58148 and 58154 is merely illustrative. As shown by connection 58152, vibrator 58146 may be connected to bracket 58150 using welds, solder, adhesive, screws or other fasteners, clips, springs, foam, press-fit members, etc.

Figure 19:
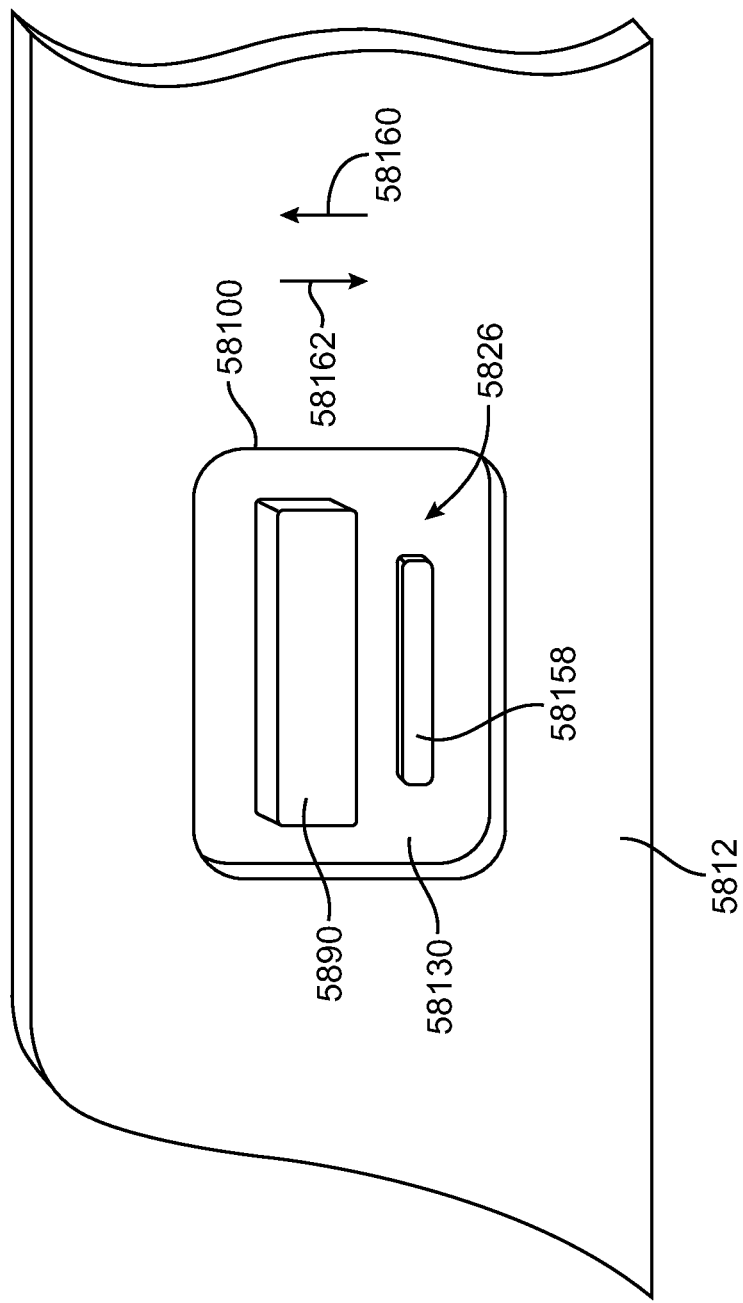
FIG. 19 is a perspective view of a button of the type shown in FIG. 13 that has a button member that protrudes through a device housing and that has a visual indicator formed from a patch of ink on a portion of the button in accordance with an embodiment of the present invention.
Figure 20:
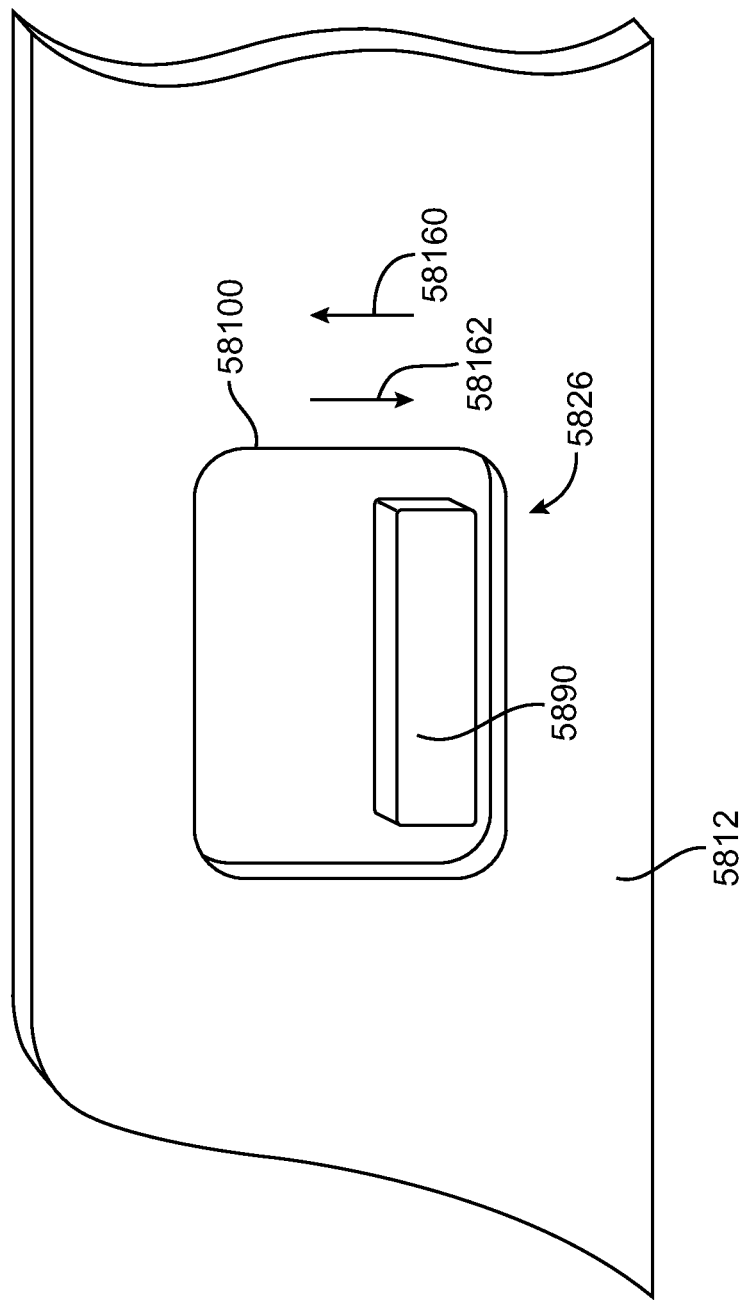
FIG. 20 is a perspective view of a button of the type shown in FIG. 19 after the button has been moved to a position that hides the visual indicator from view in accordance with an embodiment of the present invention.

A perspective view of a button of the type shown in FIG. 13 that has been formed in a sidewall of housing 5812 is shown in FIG. 19. As shown in FIG. 19, housing 5812 may have an opening that allows button member 5890 of button 5826 to move up and down in directions 58160 and 58162. A visual indicator such as colored ink patch 58158 may be provided on button member surface 58130. When button member 5890 is moved in direction 58160, indicator patch 58158 is visible and may be viewed through opening 58100. When button member 5890 is moved in direction 58162, indicator patch 58158 is hidden from view, as shown in FIG. 20.

Figure 21:
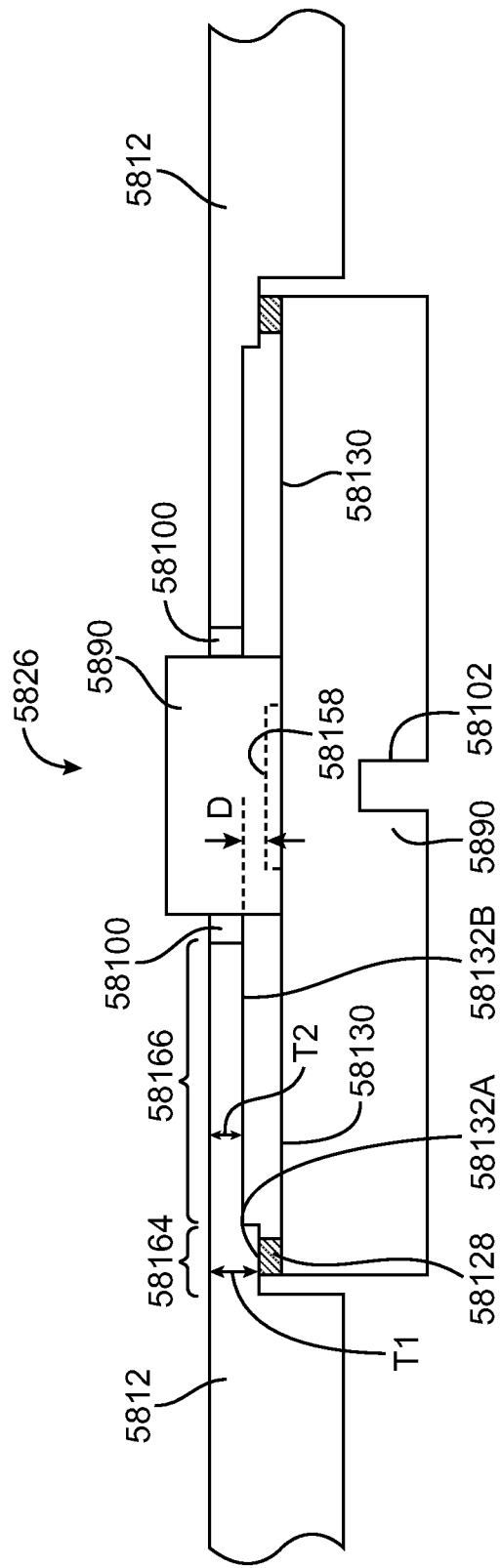
FIG. 21 is a cross-sectional view of a button of the type shown in FIGS. 19 and 20 showing how a coating may be provided on a portion of the button member to allow the button member to travel smoothly along the interior of a device housing in accordance with an embodiment of the present invention.

As shown in the cross-sectional side view of FIG. 21, the portion of housing 5812 that is nearest the protruding portion of button member 5890 (i.e., portion 58166) may have thickness T2, whereas the portion of housing 5812 that is farther from the protruding portion of button member 5890 may have thickness T1. Thickness T1 and the thickness of lubricating coating 58128 may be collectively thicker than thickness T2, so that that housing portion 58166 will be offset from surface 58130 of button member 5890. This ensures that ink layer 58158 will lie at a distance D below inner surface 58132B of housing 5812 and thereby ensures that ink 58158 will not be scratched or otherwise damaged by lower surface 58132B. Distance D may be, for example, 0.05 mm, 0.1 mm, more than 0.1 mm, etc. Lubricating coating 58128 may be formed from a slippery material such as polytetrafluoroethylene or other fluorocarbon materials, graphite, grease, polyurethane, etc. Coating 58128 may help ensure that surface 58130 of button member 5890 (e.g., a metal button member) and surface 58132A of housing structure 5812 (e.g., a metal housing wall) are characterized by low amounts of friction. This allows button 5826 to be actuated by a user without excess force.

Any suitable technique may be used to form coatings such as coating 58128. For example, coating 58128 may be deposited using physical vapor deposition, powder coating (e.g., using heat treatment), pad printing, screen printing, ink-jet printing, spraying, dipping, etc. A plastic coating may be provided on a metal member such as a metal button member or a portion of a metal housing injection molding or compression molding (e.g., by insert molding a plastic coating surface around a metal button or housing member, etc.). These techniques or other techniques may be used in forming coating 58128 between button member 5890 and housing structure 5812.

It can be difficult to design antennas that fit within the confines of a portable electronic device such as a cellular telephone while exhibiting satisfactory performance.

It would be desirable to be able to provide improved antenna structures for electronic devices.

Structures in an electronic device (e.g., device 10 of FIG. 1) such as portions of a button may be provided with conductive features that form portions of an antenna. The conductive features may include sheet metal inserts and conductive traces that are formed directly on plastic parts. With one suitable arrangement, a button support member may be provided with a metal trace and a sheet metal insert. A dome switch may be mounted on the button support member. When a button member in the button is pressed, the inner surface of the button compresses the dome switch.

According to an embodiment, an apparatus is provided that includes a button support member having a surface that has at least some laser-activated portions, and a conductive antenna trace formed directly on the surface.

According to another embodiment, an apparatus is provided that also includes housing sidewalls that are electrically connected to the conductive antenna trace.

According to another embodiment, an apparatus is provided that also includes a spring that electrically connects the conductive antenna trace to the housing sidewalls.

According to another embodiment, an apparatus is provided that also includes a conductive antenna structure on the button support member that is formed from a sheet of metal.

According to another embodiment, an apparatus is provided that also includes a dome switch mounted on the button support member.

According to another embodiment, an apparatus is provided that also includes a button member that bears against the dome switch.

According to another embodiment, an apparatus is provided that also includes conductive housing structures that are electrically connected to the conductive antenna trace, wherein the conductive housing structures have an opening and wherein the button member reciprocates within the opening.

According to these embodiments, an electronic device such as device 10 of FIG. 1 may be provided with an antenna. The antenna may be a patch antenna, a planar inverted-F antenna, an inverted-F antenna, a loop antenna, a monopole antenna, a dipole antenna, a helical antenna, or any other suitable antenna. Conductive portions of the antenna (antenna conductors) may be formed from strips of metal, patterned pieces of metal (e.g., patterned metal sheets), wires, traces on rigid and flexible printed circuit boards, metal that is formed on dielectric supports such as plastic supports, or other conductive structures that carry radio-frequency antenna signals.

If desired, space may be conserved by forming at least some portions of these conductive structures on a plastic support structure such as a button support.

Figure 22:
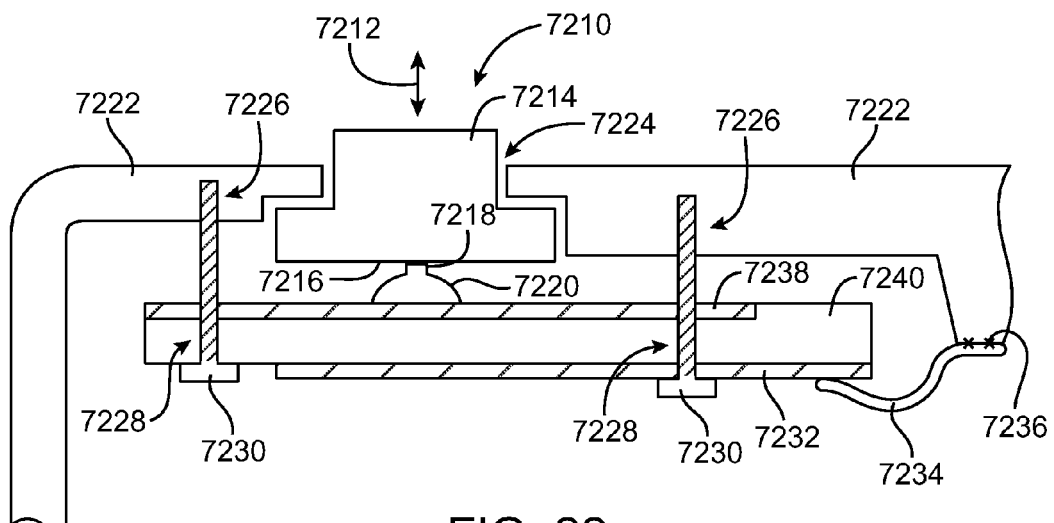
FIG. 22 is a cross-sectional view of an illustrative electronic device including a button that has a button support member with antenna structures in accordance with an embodiment of the present invention.

An illustrative electronic device (e.g., device 10 of FIG. 1) that includes a button with antenna traces is shown in FIG. 22. As shown in FIG. 22, button 7210 may have a button member such as button member 7214. Button member 7214 may be mounted in opening 7224 in housing structures 7222. Housing structures 7222 may be metal housing sidewalls. If desired, metal housing sidewalls 7222 may form part of an antenna (i.e., metal housing sidewalls 7222 may be antenna conductors).

Antenna conductors for an antenna in the electronic device may also be formed from metal members on a support structure such as button support 7240. For example, metal structure 7238 and metal structure 7232 may be antenna conductors that are supported by button support 7240. Because button support 7240 serves as a support for dome switch 7220 in button 7210 while simultaneously serving as a support for antenna conductors such as conductors 7232 and 7238, space is conserved.

During operation of button 7210, button member 7214 may be pressed inwards so that inner button member surface 7216 presses against tip 7218 of dome switch 7220. This compresses and electrically closes dome switch 7220. Dome switch 7220 may be mounted on a flexible printed circuit ("flex circuit") that is supported on button support 7240.

Button support 7240 may be attached to housing structures 7222 using fasteners such as screws 7230. These screws may pass through openings 7228 in button support 7240 and may screw into threaded bores 7226 in housing structures 7222. This type of arrangement or other mounting arrangement may be used to hold button support 7240 in a fixed position relative to housing structure 7222.

Antenna conductor 7238 may be formed from a sheet of metal that is attached to button support 7240 (e.g., using adhesive). If desired, antenna conductor 7238 may be formed from a metal trace that is formed directly on button support 7240, a part of a flex circuit, or other suitable conductive structures. Antenna conductor 7238 may be electrically connected to other structures using screws 7230 (e.g., to housing structures 7222). Antenna conductor 7232 may be electrically connected to housing structure 7222 via spring 7234, which is welded to housing structures 7222 by welds 7236 (e.g., to form part of a loop antenna).

Button support 7240 may be formed from a dielectric such as plastic. Antenna conductor 7232 may be formed from a trace of metal that is patterned directly on the surface of support 7240.

The pattern of antenna conductor 7232 (and, if desired, the pattern of antenna conductor 7238) may be formed by using a plastic member for support 7240 that has portions that are selectively activated by exposure to laser light. The plastic for support 7240 may be, for example, a thermoplastic that has an organo-metallic additive that is sensitive to light at the wavelengths produced by a laser. An antenna conductor pattern may be imposed on the plastic of support structure 7240 by exposing the plastic to laser light only in areas in which conductive antenna structures are desired. After exposing desired portions of the plastic to laser light to activate those portions, the plastic may be plated with a suitable conductor such as copper. During plating operations, the laser-activated portions of the plastic attract the plating conductor (e.g., copper), thereby forming conductive antenna trace 7232 directly on plastic support member 7240. Techniques in which laser light is used to imprint a desired plating pattern on a plastic support are sometimes referred to as laser direct structuring (LDS) techniques.

In general, conductive antenna structures such a structures 7238 and 7232 may be formed on any suitable support structure. The foregoing examples, in which conductive antenna structure are formed by coating plastic button support structures with a patterns of metal (e.g., by plating) is merely illustrative.

Figure 23:
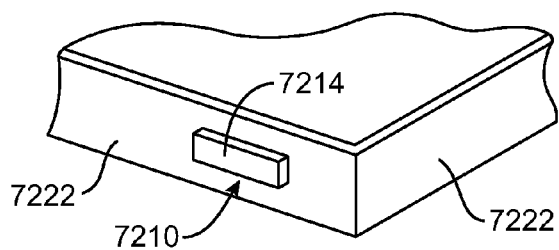
FIG. 23 is a perspective view of an exterior corner portion of an electronic device with a button in accordance with an embodiment of the present invention.

FIG. 23 is a perspective view showing how button 7210 and button member 7214 may be formed along one of the sides of an electronic device (i.e., in an opening in housing sidewalls 7222).

Electronic devices such as portable electronic devices often have buttons. Buttons may protrude from a device housing. A user may operate a button by pressing on the button.

It is sometimes desirable to form portions of a device housing from metal. Care must be taken, however, to ensure that the metal on which a button is mounted is sufficiently robust to withstand wear from repeated use of the button. Improper button mounting arrangements may lead to damage to the device housing during use.

It would therefore be desirable to be able to provide improved ways to mount button structures to electronic device housings.

This can be accomplished by providing an electronic device having buttons that are pressed by a user. The electronic device may be a portable or handheld electronic device. The electronic device may have housing portions that are made from metal. The electronic device may, for example, have a metal housing portion that forms a band around the device.

Mounting structures may be provided for attaching button assemblies to the inside of electronic device housing. An integral spring may be attached to the inside of the housing. A button plate may have button members and an opening through which the spring may be inserted, attaching the button plate through the housing. The housing may have openings through which the button members protrude to the outside of the housing.

The spring may protrude though a hole in a button plate that is located between two button members. The button plate may have slots on either side of the hole to relieve stress in the button plate when the button members are pressed by a user.

One or more springs may be provided on the inside of the housing that grasp the sides of the button plate. For example, the housing portion may have two, four, or six springs that grip the sides of the button plate when the button plate is mounted in position against the inside of a portion of the housing.

An electronic device housing may have a mounting structure such as a clip that is welded to the housing and that holds a button plate in position within a recess in the housing. The button plate may be tilted into position under the clip.

A dome switch assembly may be attached to the housing so that each button member presses on a dome switch. A housing may have screw bosses that are used to attach the dome switch assembly. A spring that is used to attach the button plate to the housing may have a screw boss that is used to attach the dome switch assembly to the housing.

In accordance with an embodiment, an electronic device in provided that includes a button plate having at least one button member, a housing structure having at least one opening through which the button member protrudes for actuation by a user, and at least one spring that attaches the button plate to the housing.

In accordance with another embodiment, an electronic device is provided wherein the button plate has at least one opening and wherein the spring fits through the opening in the button plate.

In accordance with another embodiment, an electronic device is provided wherein the spring has leaves that retain the button plate against the housing portion.

In accordance with another embodiment, an electronic device is provided wherein the spring includes a threaded bore that forms a screw boss.

In accordance with another embodiment, an electronic device is provided that also includes a dome switch assembly attached to the screw boss.

In accordance with another embodiment, an electronic device is provided wherein the button plate has two slots on opposing sides of the opening.

In accordance with another embodiment, an electronic device is provided wherein the spring includes one of a plurality of springs, wherein the button plate has sides, and wherein the plurality of springs press against the sides of the button plate.

In accordance with another embodiment, an electronic device is provided wherein the plurality of springs include at least four springs.

In accordance with another embodiment, an electronic device is provided wherein the housing structure includes a metal housing structure.

In accordance with another embodiment, an electronic device is provided wherein the electronic device has four sides and wherein the housing structure includes a metal band that surrounds the four sides.

In accordance with another embodiment, an electronic device is provided that also includes a dome switch assembly having at least one dome switch that is controlled by moving the button member.

In accordance with another embodiment, an electronic device is provided wherein the at least one button member includes two button members, wherein the dome switch assembly includes two dome switches, wherein the housing structure has at least one screw boss, and wherein the dome switch assembly attaches to the screw boss so that each of the two button members controls a respective one of the two dome switches.

In accordance with an embodiment, an apparatus is provided that includes an electronic device housing structure having first and second openings, first and second button members that protrude through the first and second openings, a button plate to which the first and second button members are attached, wherein the button plate has an opening, and a spring that is mounted to the electronic device housing structure and that passes through the opening in the button plate to hold the button plate to the electronic device housing structure.

In accordance with another embodiment, an apparatus is provided that also includes wherein the button plate has at least one slot.

In accordance with another embodiment, an apparatus is provided wherein the button plate has first and second slots on opposing sides of the opening in the button plate.

In accordance with another embodiment, an apparatus is provided wherein the spring includes a threaded bore and wherein the apparatus further includes a dome switch assembly having first and second dome switches, wherein the dome switch assembly is attached to the spring with a screw that is screwed into the threaded bore.

In accordance with another embodiment, an apparatus is provided wherein the electronic device housing structure includes a metal band that substantially surrounds four sides of an electronic device.

In accordance with another embodiment, an apparatus is provided wherein the spring is welded to the electronic device housing structure and wherein the button plate has a plurality of slots.

In accordance with an embodiment, an apparatus is provided that also includes an electronic device housing structure having at least one opening, at least one button member that reciprocates within the opening, and a button plate to which the button member is attached, and a spring that is attached to the metal electronic device housing structure and that holds the button plate to the electronic device housing structure.

In accordance with another embodiment, an apparatus is provided wherein the button plate has an opening, wherein the spring passes through the opening in the button plate, wherein the electronic device housing structure includes at least part of a metal band, wherein the button plate includes a pair of slots, wherein the spring is welded to the electronic device housing structure, and wherein the spring has leaves that retain the button plate in place against the electronic device housing structure.

In accordance with another embodiment, apparatus is provided wherein the button plate has an opening, wherein the spring passes through the opening in the button plate, wherein the electronic device housing structure includes at least part of a metal band, wherein the button plate includes a pair of slots, wherein the spring is welded to the electronic device housing structure, and wherein the spring has leaves that retain the button plate in place against the electronic device housing structure.

In accordance with these embodiments, structures are provided for mounting button assemblies to electronic device housings.

Housing structures 5612 may have openings for buttons such as buttons 7626 (see, e.g., FIG. 2A). Buttons 7626 may be push buttons, switches, rocker switches, knobs, or other suitable types of buttons. Buttons may be pressed or otherwise actuated by a user to control the function of device 10. For example, buttons 7626 may be used to switch device 10 on or off or may be used to turn display 7628 on or off. Buttons 7626 may also control audio volume (e.g., the volume of audio that is generated in association with a media playback event or a telephone call) or the volume of a ringer or other component. If device 10 has mobile telephone capabilities, buttons 7626 may be used to control mobile phone functions such as setting a vibration setting, or other suitable mobile phone functions. If device 10 has multimedia capabilities, buttons 7626 may control multimedia playback functions (e.g., play, stop, pause, forward, reverse, etc.). Device 10 may have any suitable number of buttons 7626. For example, device 10 may have one or more buttons, two or more buttons, three or more buttons, etc.

In the example of FIG. 2A, buttons 7626 are shown as being grouped together in a top left part of housing 5612. In general, buttons 7626 may be located anywhere within housing 5612 and need not be grouped together. If desired, buttons may be located on front surface 5616 (such as button 5619) or on rear surface 7632 (see, e.g., FIG. 2B).

Buttons such as buttons 7626 of FIG. 2A may be formed from button assemblies that are mounted within the interior of device 10. Button structures on the button assemblies may protrude through openings in the housing of device 10.

Figure 24:
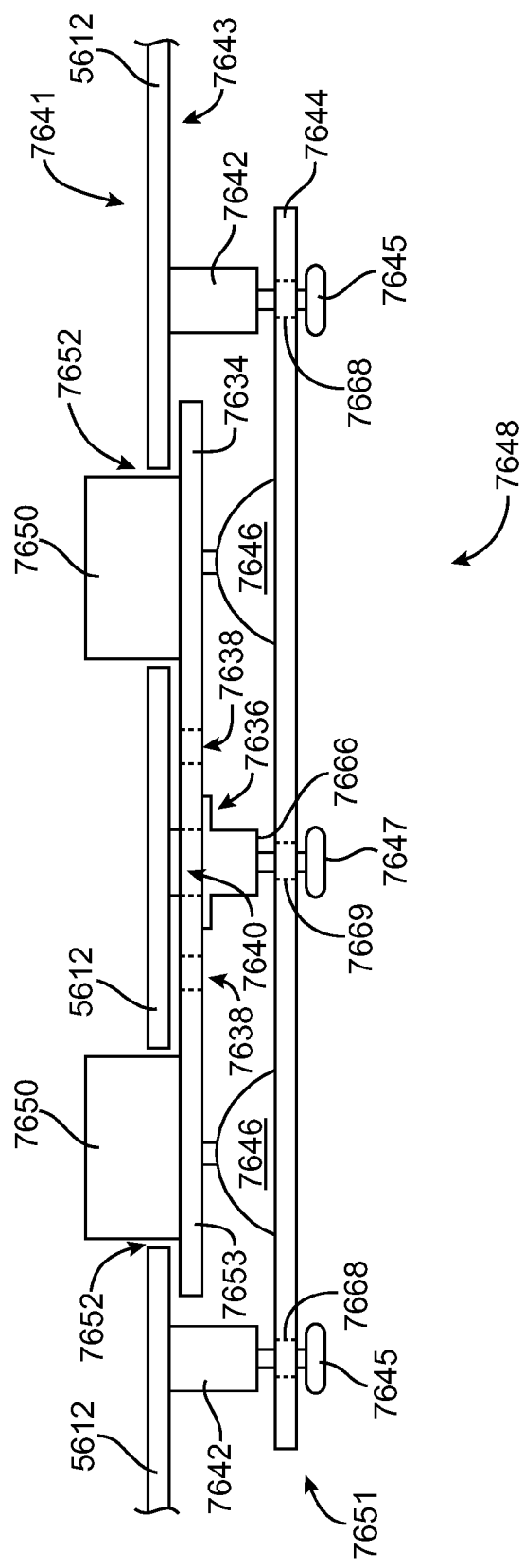
FIG. 24 is side view of an illustrative button assembly having an integral central spring in accordance with an embodiment of the present invention.

An illustrative button assembly that may be used for buttons such as buttons 7626 in FIG. 2A is shown in FIG. 24. In the example of FIG. 24, button assembly 7648 is shown as being mounted to housing structures 5612 (e.g., a metal band). Housing portion 5612 may have an exterior surface such as exterior (outside) surface 7641 and an interior surface such as interior (inner) surface 7643. Button assembly 7648 may be mounted to inner surface 7643 of housing portion 5612 so that button members 7650 protrude through openings 7652 in housing portion 5612. Button members 7650 may be push button members that may be pressed from the outside of housing portion 5612 by a user. When a user actuates the button members, the button members reciprocate within corresponding openings in the housing. Button members 7650 may be made from materials such as metal, glass, ceramic, composites, or plastic (as examples).

Button members 7650 in assembly 7648 may be mounted on a supporting plate such as button plate 7634 using welds, adhesive, fasteners, or other suitable attachment mechanisms. Button plate 7634 may be made from stainless steel, other metals, plastic, or other suitable materials. Button plate 7634 may be mounted to inner surface 7643 of housing portion 5612 (e.g., using welds, screws, adhesive, etc.). In the example of FIG. 24, housing portion 5612 has a spring (spring 7636) that is attached to inner surface 7643 of housing portion 5612. Spring 7636 may be attached in a substantially permanent fashion to housing portion 5612 (e.g., using welds, adhesive, fasteners, etc.) and may therefore sometimes be referred to as an integral spring. Spring 7636 may, for example, be formed from a spring metal that is welded to housing portion 5612.

Spring 7636 may protrude through an opening such as opening 7640 in button plate 7634. Opening 7640 in button plate 7634 may be aligned with spring 7636 on housing portion 5612. During assembly of device 10, button plate 7634 may be pressed onto spring 7636 so that spring 7636 passes through opening 7640. Spring 7636 may be compressed as it passes through opening 7640. After passing through opening 7640, spring 7636 may relax back to its original position, holding button plate 7634 against housing portion 5612. Button plate 7634 may have slots such as slots 7638 on either side of opening 7640. Slots 7638 may allow button plate 7634 to flex when either of button members 7650 is compressed.

Button assembly 7648 may have a dome switch assembly such as dome switch assembly 7651. Dome switch assembly 7651 may have dome switches such as dome switches 7646. Dome switches 7646 may be aligned with button members 7650. When a given one of button members 7650 is pressed, its corresponding dome switch 7646 will be compressed and electrical contacts inside dome switch 7646 will become electrically connected, closing the switch. Dome switches 7646 may be mounted on a supporting structure such as button bracket 7644. A rigid or flexible printed circuit board ("flex circuit") with copper traces may be electrically connected to dome switches 7646. The printed circuit may be used to interconnect dome switches to processing circuitry in device 10.

Dome switch assembly 7651 may be mounted so as to bear against inner surface 7653 of button plate 7634. To ensure that dome switch assembly 7651 is held in place when button members 7650 are depressed, dome switch assembly 7651 may be connected to housing portion 5612. As shown in the example of FIG. 24, housing portion 5612 may have screw bosses such as screw bosses 7642. Screw bosses 7642 may, for example, be welded to housing portion 5612. Screws such as screws 7645 may be inserted through openings such as openings 7668 in button bracket 7644 to attach button bracket 7644 to housing portion 5612 (e.g., by screwing into threads in bosses 7642). If desired, spring 7636 may have a threaded bore that forms an integral screw boss such as screw boss 7666. Button bracket 7644 may have an opening such as opening 7669 through which a screw such as screw 7647 may be inserted to attach button bracket 7644 to screw boss 7666 on housing portion 5612.

In the example of FIG. 24, two buttons members 7650 are shown with corresponding dome switches 7646. In general, button plates such as button plate 7634 may have any suitable number of button members 7650. For example, button plate 7634, may have one, three, four, five, or more button members 7650. Dome switch assembly 7651 may have corresponding numbers of dome switches 7646. Button plate 7634 may be attached to more than one spring 7636. For example, if button plate 7634 has three button members 7650, then button plate 7634 may have two springs 7636, each of which is located between two button members 7650. In configurations in which button plate 7634 has two button members 7650, spring 7636 may be located in a central position, corresponding to an opening such as opening 7640, which is located in the center of button plate 7634. If button plate 7634 has more than two button members 7650, springs 7636 may be located between pairs of respective button members 7650, so that a button member is located on either side of each spring 7636. Housing portions 5612 may have any suitable number of screw bosses for attaching to dome switch assembly 7651.

Figure 25A:
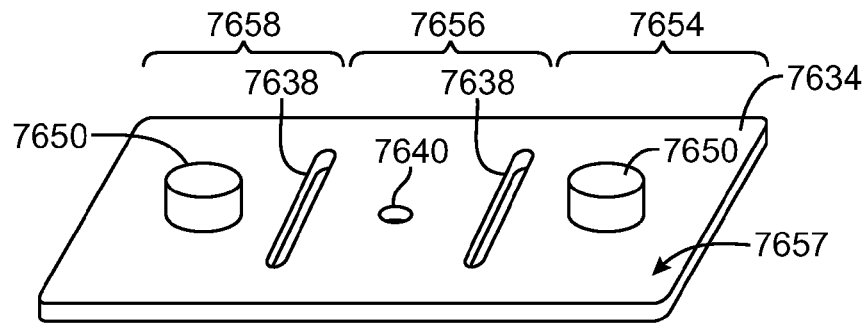
FIG. 25A is a front perspective view of a button plate having button members in accordance with an embodiment of the present invention.

A top perspective view of button plate 7634 is shown in FIG. 25A. Button plate 7634 may have button members 7650 that protrude from a top surface (or outer surface) of button plate 7634 such as top surface 7657. Button members 7650 may be formed as integral portions of button plate 7634 or may be separate structures that are attached to button plate 7634. Button members 7650 may be attached to plate 7634 using welds, adhesive, fasteners, press-fitting techniques, etc. If desired, button plate 7634 may have openings through which button members 7650 are inserted. Button members 7650 may be fixed to button plate 7634, or, if desired, button members 7650 may be allowed to slide through openings in button plate 7634 when button members 7650 are pressed by a user.

Button plate 7634 may have slots such as slots 7638 on either side of opening 7640. Slots 7638 may allow button plate 7634 to flex. For example, if the button member on right portion 7654 of button plate 7634 is pressed, slot 7638 may allow right portion 7654 of button plate 7634 to move with the button press, while mid-portion 7656 and left portion 7658 of button plate 7634 remain stationary. If button plate 7634 has more than two button members 7650, button plate 7634 may have more than one opening 7640 and more than one pair of slots 7638.

Figure 25B:
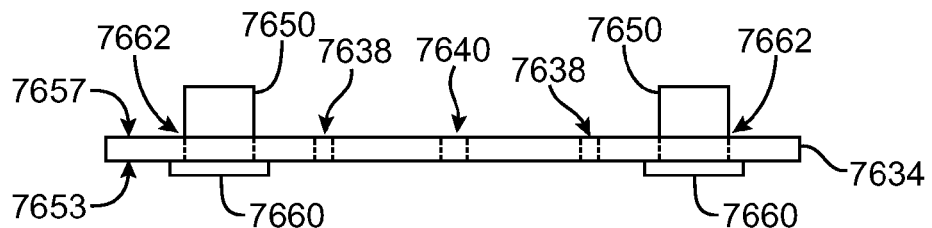
FIG. 25B is a side view of a button plate having button members in accordance with an embodiment of the present invention.

FIG. 25B is a side view of button plate 7634. In the example of FIG. 25B, button members 7650 have been inserted through openings 7662 of button plate 7634. Button members 7650 protrude from top surface 7657 of button plate 7634. Button members 7650 may have bases such as bases 7660 that are wider than openings 7662 in button plate 7634. This type of arrangement is, however, merely illustrative. If desired, button members may have bases that are inset into bottom surface 7653 of button plate 7634 so that bases 7660 are flush with inner surface 7653. Button members 7650 may also have bases 7660 that are no wider than openings 7662. If desired, button members 7650 may be mounted directly on top surface 7657 of button plate 7634 (i.e., in a configuration in which button plate 7634 does not have any corresponding openings 7662).

Figure 25C:
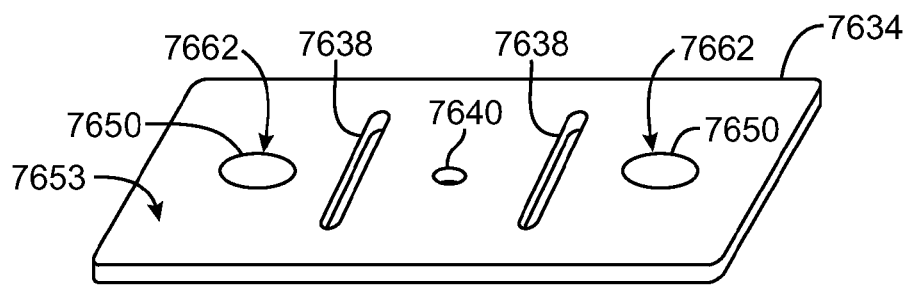
FIG. 25C is a rear perspective view of a button plate having button members in accordance with an embodiment of the present invention.

FIG. 25C is a bottom perspective view of button plate 7634. In the illustrative example of FIG. 25C, button members 7650 are visible in openings 7662 on the bottom surface 7653 of button plate 7634. If desired, button members 7650 may be mounted directly to top surface 7657 of button plate 7634 so that button members 7650 are not visible on bottom surface 7653 of button plate 7634.

Figure 26:
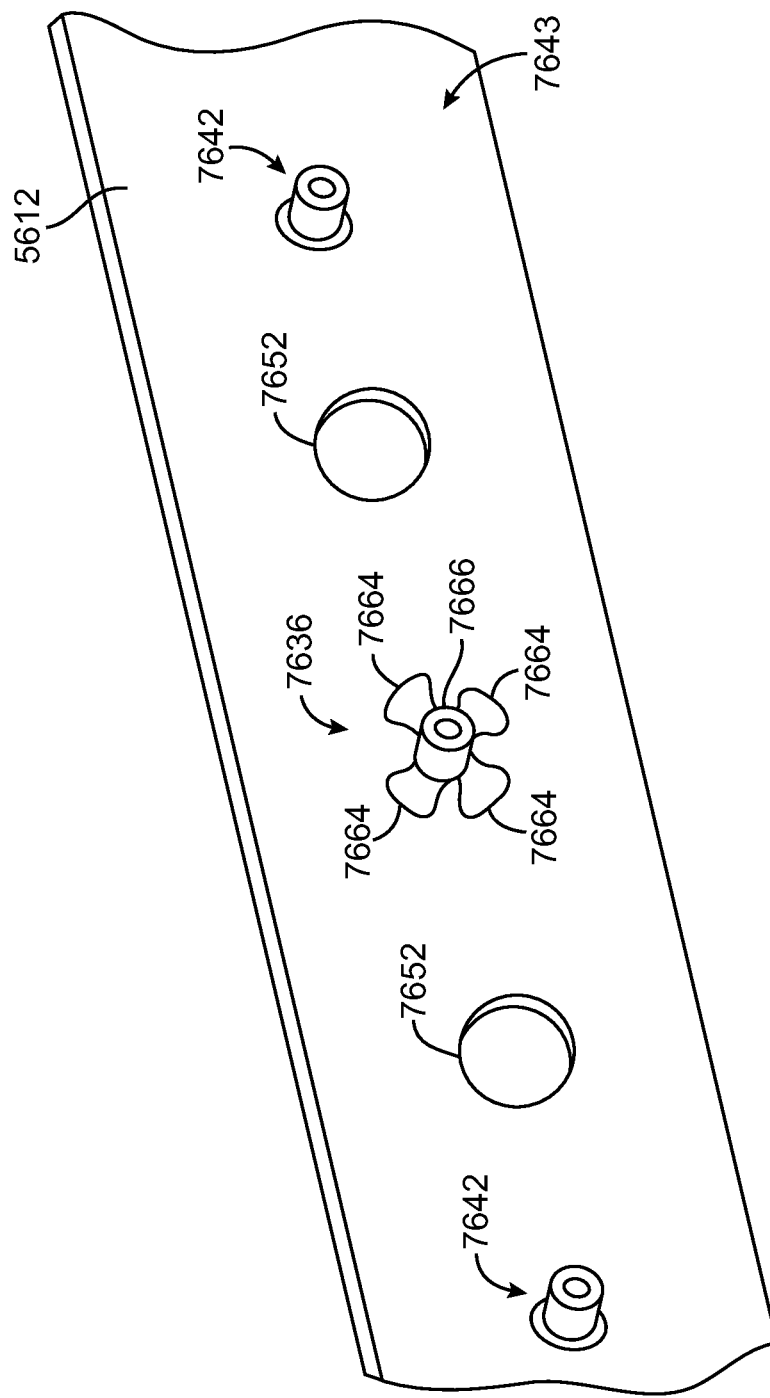
FIG. 26 is a perspective view of a portion of an electronic device housing having an integral spring in accordance with an embodiment of the present invention.

FIG. 26 is a perspective view of housing portion 5612 in the vicinity of spring 7636. As shown in FIG. 26, spring 7636 may be formed on inside surface 7643 of housing portion 5612. Spring 7636 may have leaves such as leaves 7664. Leaves 7664 may be springy and may be used to hold button plate 7634 to housing portion 5612. Spring 7636 may have any suitable number of leaves 7664. In the example FIG. 26, spring 7636 has four leaves 7664. Spring 7636 may have optional screw boss 7666 that attaches to button bracket 7644 or other desired components. Housing portion 5612 may have screw bosses 7642 that attach to button bracket 7644 on either side of button plate 7634 (see, e.g., FIG. 24). Openings 7652 in housing portion 5612 may receive button members such as button members 7650 (see, e.g., FIG. 24).

Figure 27:
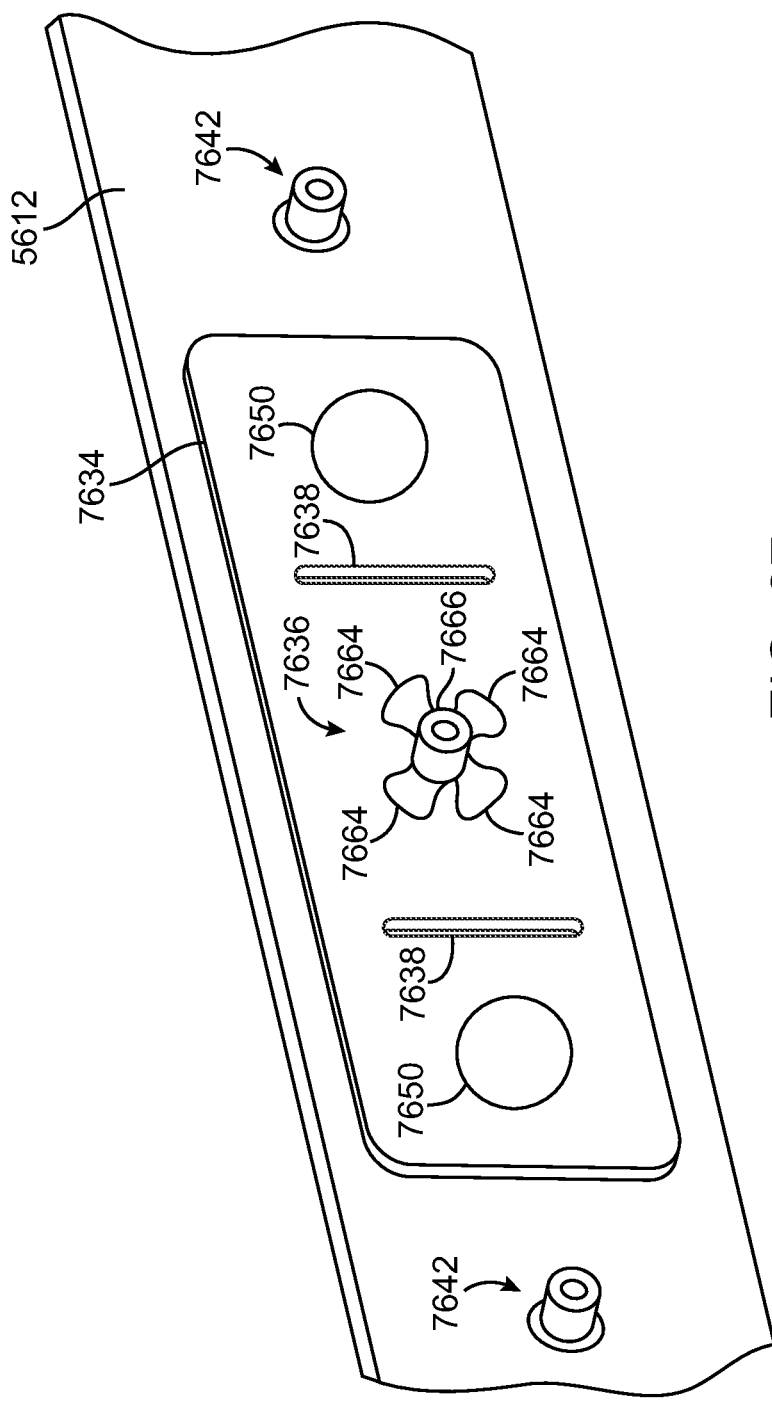
FIG. 27 is a perspective view of a button plate attached to a portion of an electronic device housing that has an integral spring in accordance with an embodiment of the present invention.

FIG. 27 is a perspective view of button plate 7634 attached to housing portion 5612. Button plate 7634 may be pressed onto spring 7636. Leaves 7664 on spring 7636 may bend when being passed through hole 7640 on button plate 7634 (see, e.g., FIGS. 25A-25C). After passing through hole 7640 on button plate 7634, leaves 7664 may snap back into position, securing button plate 7634 to housing portion 5612. Button members 7650 on button plate 7634 may pass through holes 7652 on housing portion 5612 (see, e.g., FIG. 26). Slots 7638 may allow button plate 7634 to flex when either of button members 7650 is pressed by a user. Screw bosses 7642 and screw boss 7666 may be used to attach bracket 7644 (see, e.g., FIG. 24). Screw boss 7666 may be part of spring 7636. Screw bosses 7642 may lie on either side of button plate 7634. If desired, screw bosses 7642 and 7666 may be used to attach additional components.

Figure 28:
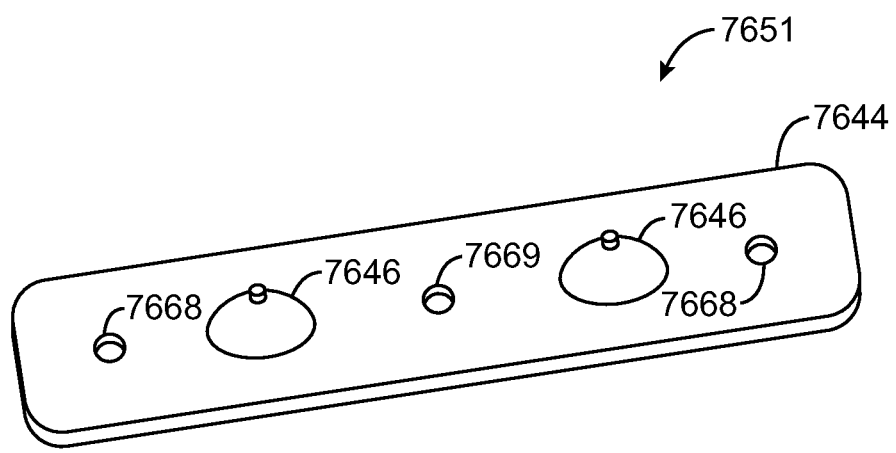
FIG. 28 is a perspective view of a dome switch assembly in accordance with an embodiment of the present invention.

FIG. 28 is a perspective view of dome switch assembly 7651. Dome switch assembly 7651 may have a supporting structure such as button bracket 7644. Dome switches 7646 may be attached to button bracket 7644 using adhesive or other suitable fastening techniques. Button bracket 7644 may have screw holes 7668 and 7669 that are used to attach bracket 7644 to screw bosses 7642 and 7666 on housing portion 5612 (see, e.g., FIG. 24).

Figure 29:
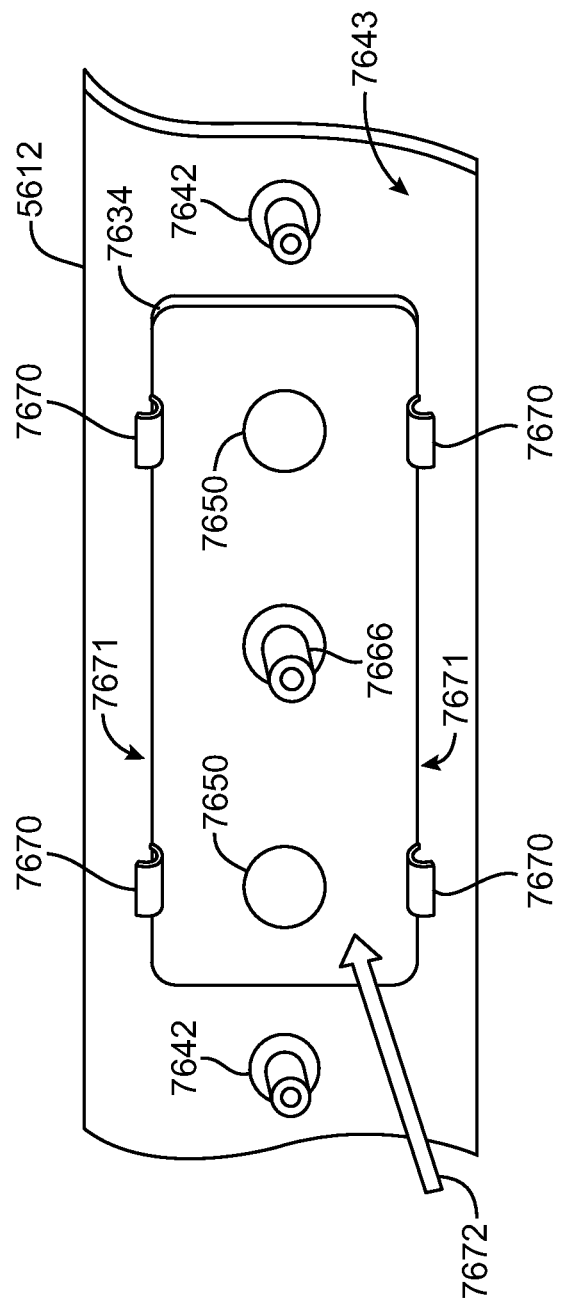
FIG. 29 is a perspective view of a button plate attached to a portion of an electronic device housing four side springs in accordance with an embodiment of the present invention.

Another illustrative example of how button plate 7634 may be attached to housing portion 5612 is shown in the perspective view of FIG. 29. Housing portion 5612 may have one or more springs 7670. In the example of FIG. 29, four springs 7670 are shown, although, in general, housing portion 5612 may have any suitable number of springs 7670. For example, housing portion 5612 may have two or six springs. Springs 7670 may be welded to housing portion 5612 and may therefore sometimes be referred to as integral springs. Button plate 7634 may be pressed into position against inside surface 7643 of housing portion 5612, between springs 7670. For example, button plate 7634 may be pressed in the direction of arrow 7672 (i.e., straight into housing portion 5612). When button plate 7634 is in position against housing portion 5612, springs 7670 will press against the edges of button plate 7634 such as edges 7671. Button members 7650 may protrude through holes in housing portion 5612. Screw boss 7666 may be welded to housing portion 5612 and may fit through a hole in button plate 7634. A dome switch assembly of the type shown in FIG. 28 may be attached to screw boss 7666 to housing 5612. Screw bosses such as screw bosses 7642 may be located on either side of button plate 7634 and may also be used in attaching the dome switch assembly to housing 5612.

Figure 30:
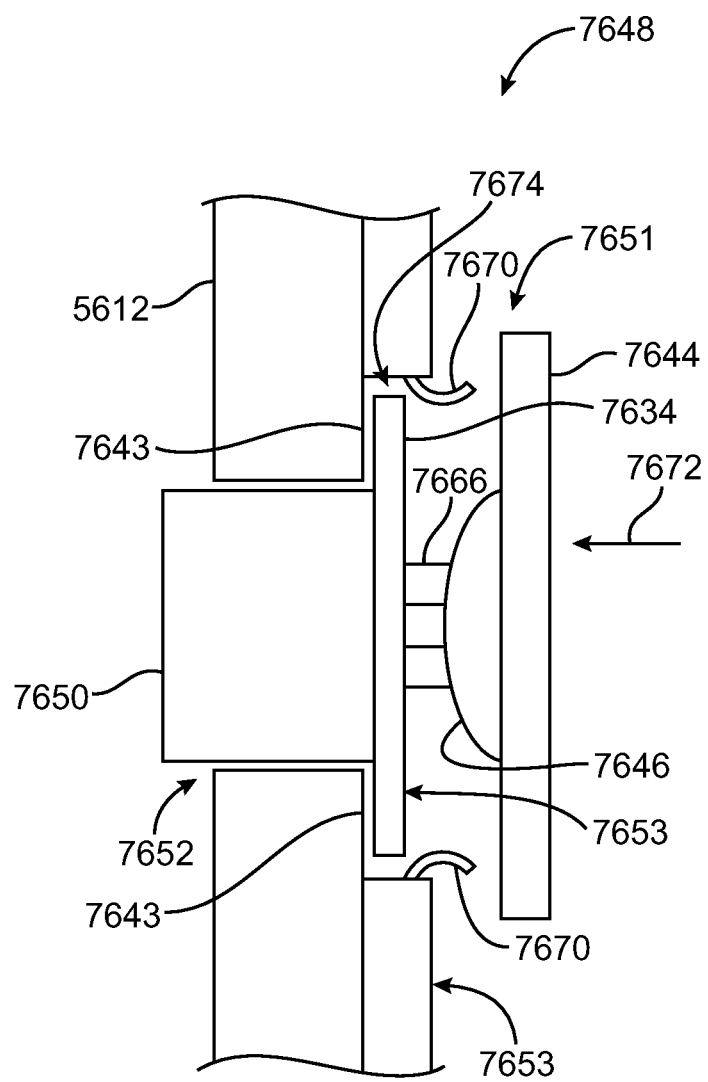
FIG. 30 is side view of a button assembly having four side springs in accordance with an embodiment of the present invention.

FIG. 30 is a side view of button assembly 7648 having springs 7670 as shown in FIG. 29. As shown in FIG. 30, housing portion 5612 may have openings such as opening 7652. Housing portion 5612 may have springs such as springs 7670. Button plate 7634 may have button members such as button member 7650 that fits through opening 7652 in housing portion 5612. Button plate 7634 may be mounted in recessed portion 7674 of housing 5612. Springs 7670 are attached to housing portion 5612 and may hold button bracket 7644 in position. To insert button plate 7634 into position against housing 5612, button plate 7634 may be pressed in direction 7672 (i.e., towards inner surface 7643 of housing 5612). Button bracket 7644 and dome switch 7646 of dome switch assembly 7651 may fit against underside 7653 of button plate 7634. Housing portion 5612 may have a screw boss such as screw boss 7666 that attaches button bracket 7644 and other portions of dome switch assembly 7651 to housing portion 5612.

Figure 31:
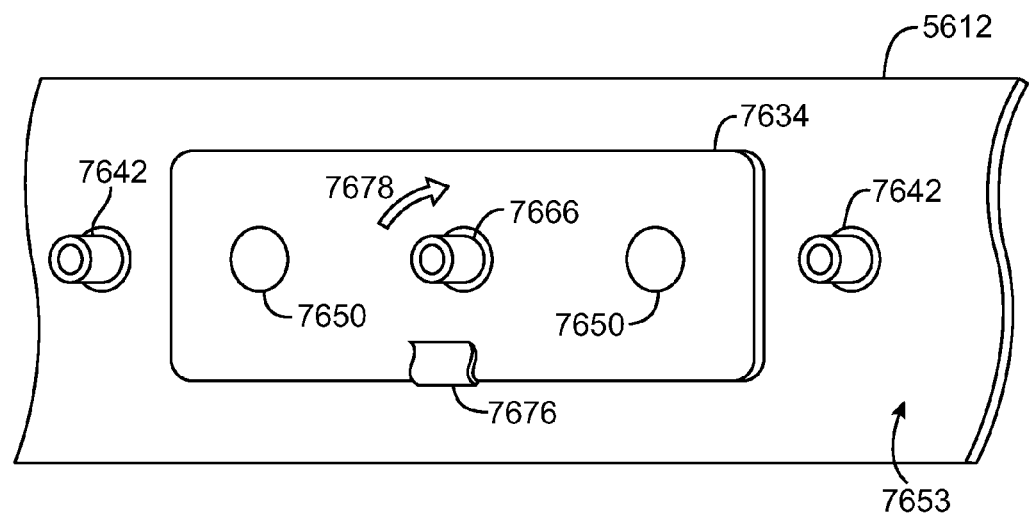
FIG. 31 is a perspective view of a button plate attached to a band-shaped housing structure using a clip in accordance with an embodiment of the present invention.

Another illustrative example of how button plate 7634 may be attached to housing portion 5612 is shown in FIG. 31. Button plate 7634 of FIG. 31 has button members 7650 that fit through corresponding openings in housing portion 5612 such as opening 7652 in FIG. 32. Housing portion 5612 may have a screw boss 7666 that protrudes though a corresponding opening in button plate 7634. Screw bosses such as screw boss 7666 and screw bosses 7642 may be used to attach a dome switch assembly such as dome switch assembly 7651 of FIG. 32. Housing portion 5612 may have a clip such as clip 7676. Clip 7676 may be formed from spring metal or other suitable materials. Clip 7676 may be welded to metal band 5612 or other housing structures. Clip 7676 may be used to attach button plate 7634 to metal band 5612. Clip 7676 may be sufficiently rigid to hold plate 7634 in place. Button plate 7634 may be tilted into position. For example, button plate 7634 may be tilted in the direction of arrow 7678 in order to slide button plate 7634 under clip 7676. Housing portion 5612 may have any suitable number of clips 7676.

Figure 32:
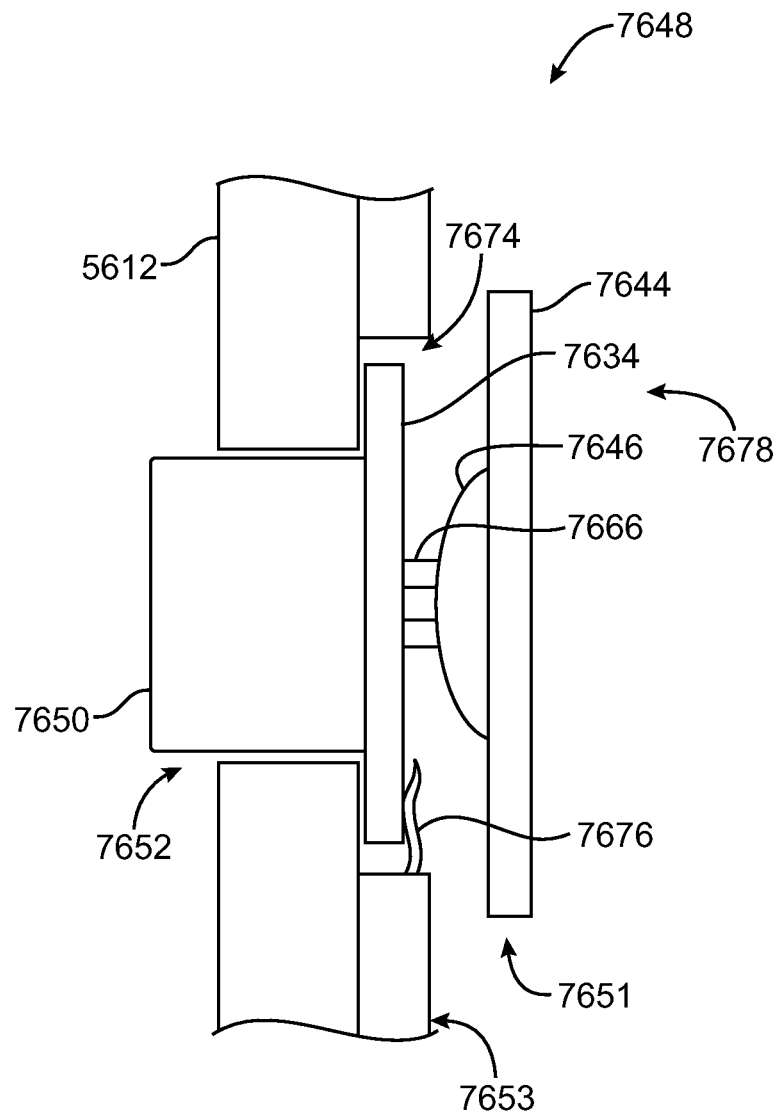
FIG. 32 is a side view of a button assembly having a clip in accordance with an embodiment of the present invention.

FIG. 32 is a side view of button assembly 7648 having a clip such as clip 7676. Housing portion 5612 may have openings such as opening 7652. Button plate 7634 may have button members such as button member 7650. Button member 7650 may fit through opening 7652 in housing portion 5612. Button plate 7634 may be tilted into position against inner surface 7643 of housing portion 5612. Button plate 7634 may reside in a recessed portion 7674 of housing 5612. During assembly of device 10, button plate 7634 may be tilted in the direction of arrow 7678 in order to slide button plate 7634 under clip 7676. Clip 7676 may be sufficiently rigid to retain plate 7634.

After button plate 7634 has been inserted into position, dome switch assembly 7651 may be attached to housing portion 5612. Dome switch assembly 7651 may have button bracket 7644 and dome switches such as dome switch 7646. Housing portion 5612 may have screw bosses such as screw bosses 7666. Screw boss 7666 may be used to attach button bracket 7644 to housing portion 5612.

If desired, button mounting structures of the types shown in FIGS. 27, 29, and 31, may be used in combination. For example, housing portion 5612 may have a spring such as spring 7636 of FIG. 27 that protrudes through an opening in button plate 7634 as well as springs such as springs 7670 of FIG. 29 that grip the edges of button plate 7634.

Electronic devices such as portable electronic devices often have buttons. Buttons may protrude from a device housing. A user may operate a button by pressing on the button.

It is sometimes desirable to form portions of a device housing from metal. Metal housing may have improved structural or aesthetic properties. Buttons may also be formed from metal.

Button assemblies may sometimes have undesired friction or motion. Undesired wear and tear may result from friction between parts. Button members that are loosely held in button assemblies may have undesired movement and may rattle. Button members that rattle may feel unpleasant to a user and may generate undesired noise. Undesirable friction and rattle may be increased when a housing and button are formed from materials such as metal.

It would therefore be desirable to be able to provide ways to reduce unwanted friction and undesired motion in electronic device button assemblies.

This can be accomplished by providing an electronic device (e.g., device 10 of FIGS. 1, 2A, and 2B) with buttons that are pressed by a user. The electronic device may have housing portions that are made from metal. The electronic device may, for example, have a metal housing portion that forms a band around the device. Protruding button members and planar button members (button plates) may be formed from metal.

Button assemblies may be provided with a member such as a silicone sheet that is interposed between the housing and button plates. This layer of material may reduce undesired motion and rattle of the buttons. This layer of material may also reduce wear on the buttons from metal-on-metal contact.

Button assemblies may have button plates with nubs that are inserted through holes in the button plates. The nubs may be silicone nubs and may protrude on each side of the button plate. The nubs may reduce motion of the button plates with respect to the device housing.

A button member may have a ring such as a silicone ring that encircles the base of the button member. The ring may reduce friction and wear between a button member and device housing when a button member is actuated by a user. If desired, the ring may be a coating on the button member.

An anti-roll bar may be attached to a button member to guide the motion of the button member when it is pressed by a user. The anti-roll bar may be coated to reduce friction and wear between the anti-roll bar and device housing.

A spring may be attached to a button plate having a button member. The spring may press against a button bracket having dome switches. The spring may reduce undesired movement of the button member. The spring may be compressed when the button member is pressed by a user and may guide the motion of the button member.

According to an embodiment, an electronic device button assembly is provided that includes a metal housing structure having an opening, a button member within the opening in the housing structure, a button plate formed on the button member, and a polymer layer interposed between the button plate and the housing structure.

According to another embodiment, an electronic device button assembly is provided wherein the polymer layer is attached with adhesive to the button plate and to the metal housing structure.

According to another embodiment, an electronic device button assembly is provided wherein the polymer layer includes a silicone layer.

According to another embodiment, an electronic device button assembly is provided wherein the polymer layer flexes when the button member is pressed and wherein the button member and button plate are formed from metal.

According to an embodiment, an electronic device button assembly that includes a metal housing structure having at least one opening, at least one button member corresponding to the at least one opening in the housing structure, a button plate attached to the button member, and polymer nubs inserted in the button plate that contact the metal housing structure and prevent the button plate from contacting the metal housing structure.

According to another embodiment, an electronic device button assembly is provided wherein the least one button member includes two button members, wherein the at least one opening in the metal housing structure includes two openings, and wherein the polymer nubs inserted in the button plate include polymer nubs inserted in the button plate between the two button members.

According to another embodiment, an electronic device button assembly is provided wherein the polymer nubs include four or more polymer nubs.

According to another embodiment, an electronic device button assembly is provided wherein the polymer nubs include silicone nubs.

According to another embodiment, an electronic device button assembly is provided wherein the polymer nubs are compression molded polymer nubs.

According to another embodiment, an electronic device button assembly is provided that also includes a ring surrounding the button member, wherein the ring is interposed between the button member and the metal housing structure and wherein the button member includes a metal button member.

According to an embodiment, an electronic device button assembly is provided that includes a metal housing structure having an opening, a metal button member mounted within the opening of the housing structure, and a ring surrounding the metal button member, wherein the ring is interposed between the metal button member and the metal housing structure.

According to another embodiment, an electronic device button assembly is provided wherein the ring includes an elastomeric ring.

According to another embodiment, an electronic device button assembly is provided wherein the ring includes a coating on the metal button member.

According to another embodiment, an electronic device button assembly is provided wherein the metal button member has a recessed portion and wherein the ring is mounted in the recessed portion of the metal button member.

According to an embodiment, an electronic device button assembly is provided that includes an electronic device housing structure having an opening, a button member within the opening of the housing structure, and an anti-roll bar attached to the button member, wherein the anti-roll bar has a coating.

According to another embodiment, an electronic device button assembly is provided wherein the coating includes a polymer coating, wherein the electronic device includes a handheld device, and wherein the electronic device housing structure includes a metal sidewall member.

According to an embodiment, a portable electronic device button assembly is provided that includes a portable electronic device housing structure having an opening, a button member that reciprocates within the opening in the portable electronic device housing structure, a button plate structure attached to the button member, a button support member, and a dome switch mounted on the button support bracket, wherein the button plate structure has at least one spring that presses against the button support member.

According to another embodiment, a portable electronic device button assembly is provided wherein the at least one spring includes two springs that contact the button support member on either side of the dome switch.

According to another embodiment, a portable electronic device button assembly is provided wherein the portable electronic device housing structure includes a metal housing wall and wherein the spring is configured to compress when the button member is pressed by a user.

According to another embodiment, a portable electronic device button assembly is provided wherein the portable electronic device housing structure is formed from metal and wherein the button plate structure is formed from metal.

Housing structures 5612 may have openings for buttons such as buttons 7626. Buttons 7626 may be push buttons, switches, rocker switches, knobs, or other suitable types of buttons. Buttons may be pressed or otherwise actuated by a user to control the function of device 10. For example, buttons 7626 may be used to switch device 10 on or off or may be used to turn display 7814 on or off. Buttons 7626 may also control audio volume (e.g., the volume of audio that is generated in association with a media playback event or a telephone call) or the volume of a ringer or other component. If device 10 has mobile telephone capabilities, buttons 7626 may be used to control mobile phone functions such as setting a vibration setting, or other suitable mobile phone functions. If device 10 has multimedia capabilities, buttons 7626 may control multimedia playback functions (e.g., play, stop, pause, forward, reverse, etc.). Device 10 may have any suitable number of buttons 7626. For example, device 10 may have one or more buttons, two or more buttons, three or more buttons, etc.

In the example of FIG. 2A, buttons 7626 are shown as being grouped together in a top left part of housing 5612. In general, buttons 7626 may be located anywhere within housing 5612 and need not be grouped together.

Buttons such as buttons 7626 of FIG. 2A may be formed from button assemblies that are mounted within the interior of device 10. Button structures on the button assemblies may protrude through openings in the housing of device 10.

Figure 33:
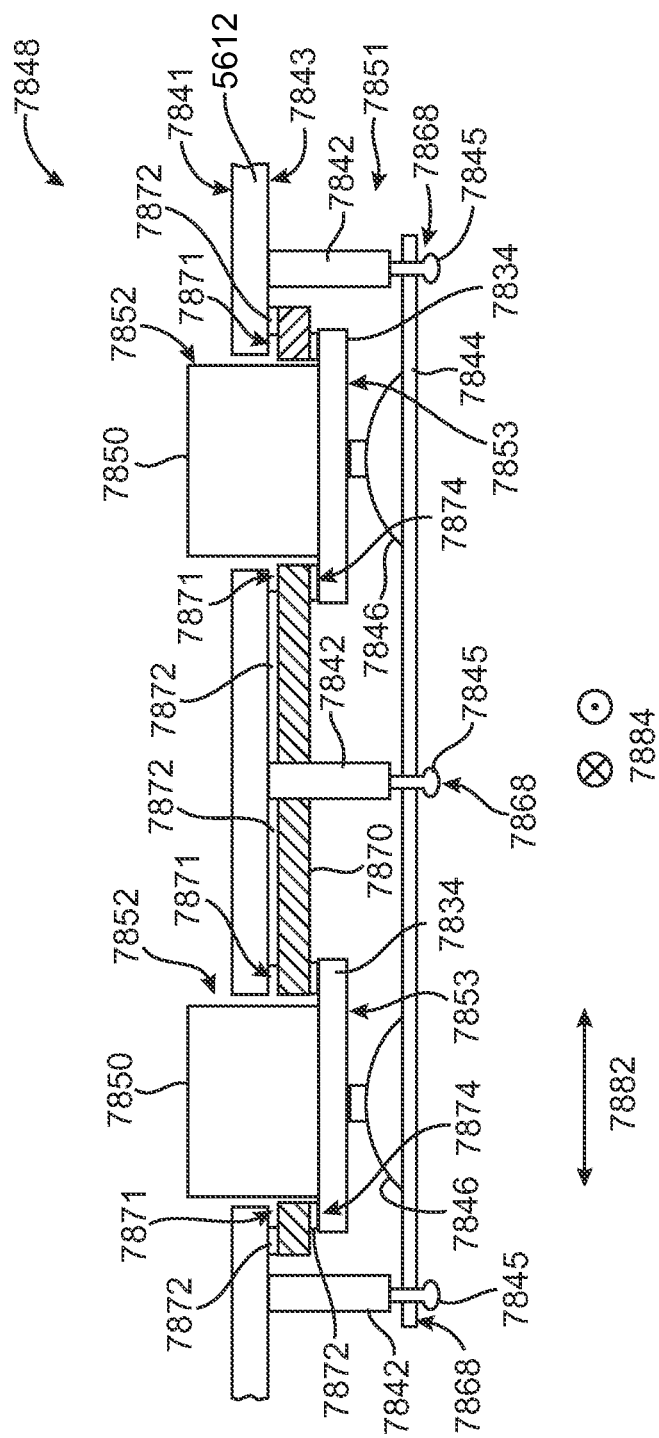
FIG. 33 is a cross-sectional side view of a button assembly having a layer of material such as plastic between a housing structure and button plates in accordance with an embodiment of the present invention.

An illustrative button assembly that may be used for buttons such as buttons 7626 in FIG. 2A is shown in FIG. 33. In the example of FIG. 33, button assembly 7848 is shown as being mounted to housing structure 5612 (e.g., a metal band). Housing portion 5612 may have an exterior surface such as exterior (outside) surface 7841 and an interior surface such as interior (inner) surface 7843. Button assembly 7848 may be mounted to inner surface 7843 of housing portion 5612 so that button members 7850 protrude through openings 7852 in housing portion 5612. Button members 7850 may be push button members that may be pressed from the outside of housing portion 5612 by a user. When a user actuates the button members, the button members reciprocate within corresponding openings 7852 in the housing. Button members 7850 may be made from materials such as metal, glass, ceramic, composites, or plastic (as examples).

Button members 7850 in assembly 7848 may be mounted on supporting plates such as button plates 7834 using welds, adhesive, fasteners, or other suitable attachment mechanisms. If desired, each plate 7834 and its associated button member 7850 may be formed as an integral structure. Button plates 7834 may be made from stainless steel, other metals, plastic, or other suitable materials. Button plate 7834 may be also referred to as a button plate structure. In the example of FIG. 33, each button member 7850 is mounted to a corresponding button plate 7834. However, if desired, more than one button member 7850 may be mounted on a single button plate (e.g., to form a rocker switch).

A layer of material such as layer 7870 may be interposed between housing structure 5612 and button plates 7834. Layer 7870 may be made from a polymer or plastic such as silicone, or other materials. Layer 7870 may be planar and may sometimes be referred to as a planar member or plate. Layer 7870 may be attached to inner surface 7843 of housing structure 5612 with an adhesive such as adhesive 7872. Layer 7870 may be attached to the top surfaces of button plates 7834 with an adhesive such as adhesive 7872. Layer 7870 may reduce unwanted wear from metal-on-metal contact. Layer 7870 may serve to minimize unwanted movement such as lateral movement that could lead to rattle. In particular, layer 7870 may reduce undesired motion of button members 7850 and button plate 7834 in side-to-side directions 7882 and 7884 parallel to the planar exterior surface of housing structure 5612. Layer 7870 may also help secure button plate 7834 against housing structure 5612. Adhesive 7872 may be applied along the surface of layer 7870. Regions near button members 7850 such as regions 7871 may be left without adhesive 7872 so that layer 7870 may flex when button member 7850 is pressed by a user.

Button assembly 7848 may have a dome switch assembly such as dome switch assembly 7851. Dome switch assembly 7851 may have dome switches such as dome switches 7846. Dome switches 7846 may be aligned with button members 7850. When a given one of button members 7850 is pressed, its corresponding dome switch 7846 will be compressed and electrical contacts inside dome switch 7846 will become electrically connected, closing the switch. Dome switches 7846 may be mounted on a supporting structure such as button bracket 7844. Button bracket 7844 may be also referred to as a button support member. A rigid or flexible printed circuit board ("flex circuit") with copper traces may be electrically connected to dome switches 7846. The printed circuit may be used to interconnect dome switches to processing circuitry in device 10.

Dome switch assembly 7851 may be mounted so that switches 7846 bear against inner surface 7853 of button plate 7834. To ensure that dome switch assembly 7851 is held in place when button members 7850 are depressed, dome switch assembly 7851 may be connected to housing portion 5612. As shown in the example of FIG. 33, housing portion 5612 may have screw bosses such as screw bosses 7842. Screw bosses 7842 may, for example, be welded to housing portion 5612. Screws such as screws 7845 may be inserted through openings such as openings 7868 in button bracket 7844 to attach button bracket 7844 to housing portion 5612 (e.g., by screwing into threads in bosses 7842). Housing portions 5612 may have any suitable number of screw bosses 7842 for attaching to dome switch assembly 7851.

Figure 34:
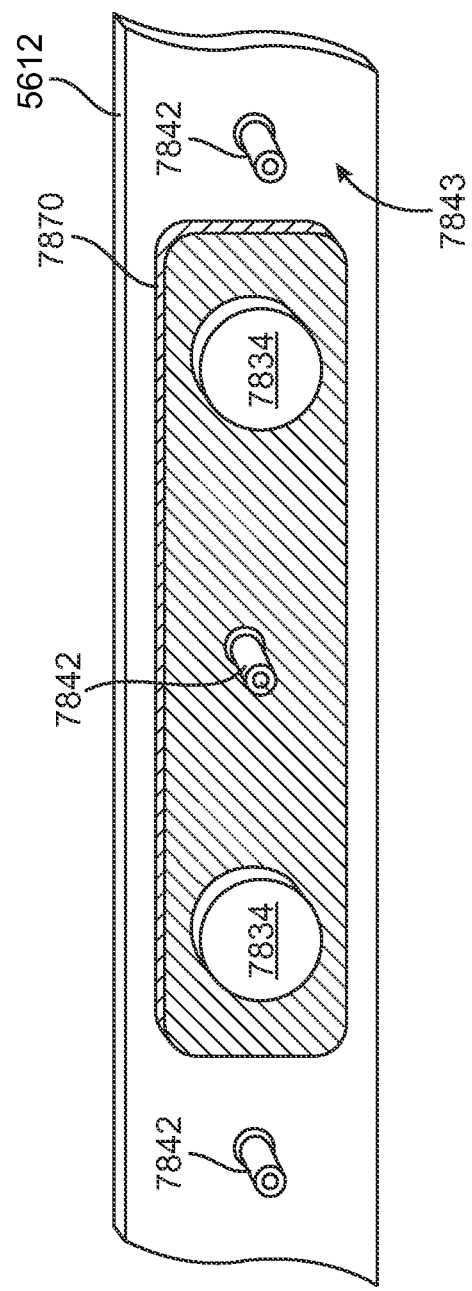
FIG. 34 is a bottom perspective view of a layer of material such as plastic between a housing structure and button plates in accordance with an embodiment of the present invention.

FIG. 34 is a perspective view of housing structure 5612 and layer 7870. Layer 7870 may be attached to inner surface 7843 of housing structure 5612. Button members 7850 (see, e.g., FIG. 33) may be inserted through openings in layer 7870 and housing structure 5612. Button plates 7834 may be attached to button members 7850. Button plates 7834 may be attached to layer 7870 with an adhesive such as adhesive 7872. Screw bosses such as screw bosses 7842 may be attached to housing structure 5612 and may be used to attach structures such as dome assembly 7851 (see, e.g., FIG. 33). In the example of FIG. 34, two buttons are inserted through layer 7870. In general, any number of buttons may be inserted through each layer 7870.

Figure 35:
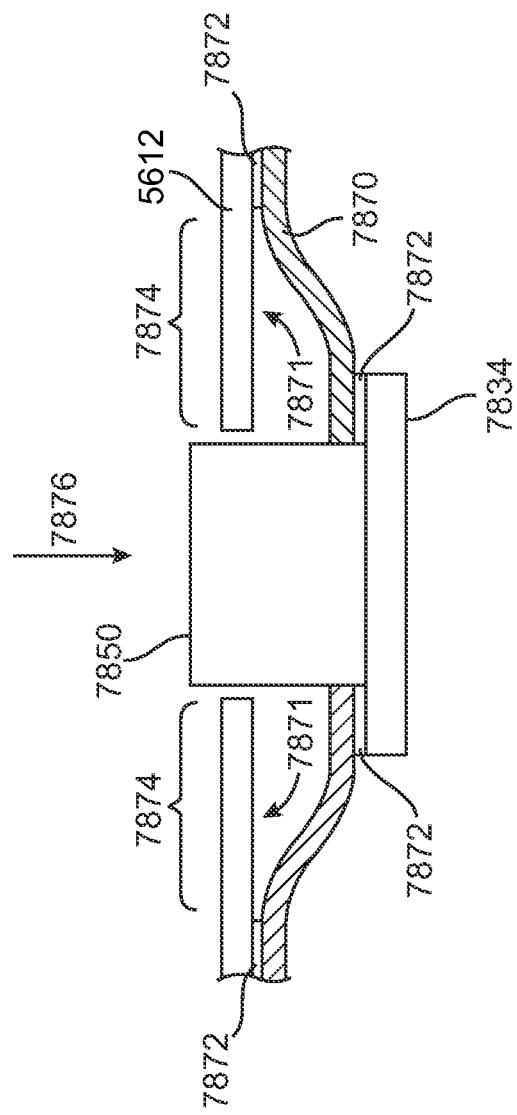
FIG. 35 is a side view of a layer of material such as plastic that is flexed when as a button member is pressed by a user in accordance with an embodiment of the present invention.

Layer 7870 may flex when button member 7850 is pressed by a user, as illustrated in the example of FIG. 35. In the example of FIG. 35, layer 7870 is attached with adhesive 7872 to housing structure 5612. There may be regions without adhesive 7872 such as regions 7871 that are immediately adjacent to button member 7850. When button member 7850 is pressed by a user (in a direction denoted by arrow 7876), portions of layer 7870 that are attached by adhesive 7872 to button plate 7834 may move in direction 7876 along with button plate 7834 and button member 7850. The movement of layer 7870 may help guide button member 7850 in direction 7876. The movement of layer 7870 may also serve as a motion dampener, dampening the motion of button member 7850. When button member 7850 returns to its original position, layer 7870 may cushion the impact of button plate 7834 against housing structure 5612. When button member 7850 is pressed by a user, such as in the example of FIG. 35, button member 7850 may be said to be in a depressed position, a pressed position, an actuated position, or a down position. When button member 7850 is not being pressed by a user, such as in the example of FIG. 33, button member 7850 may be said to be in an unpressed position, unactuated position, an initial position, or an up position.

Figure 36:
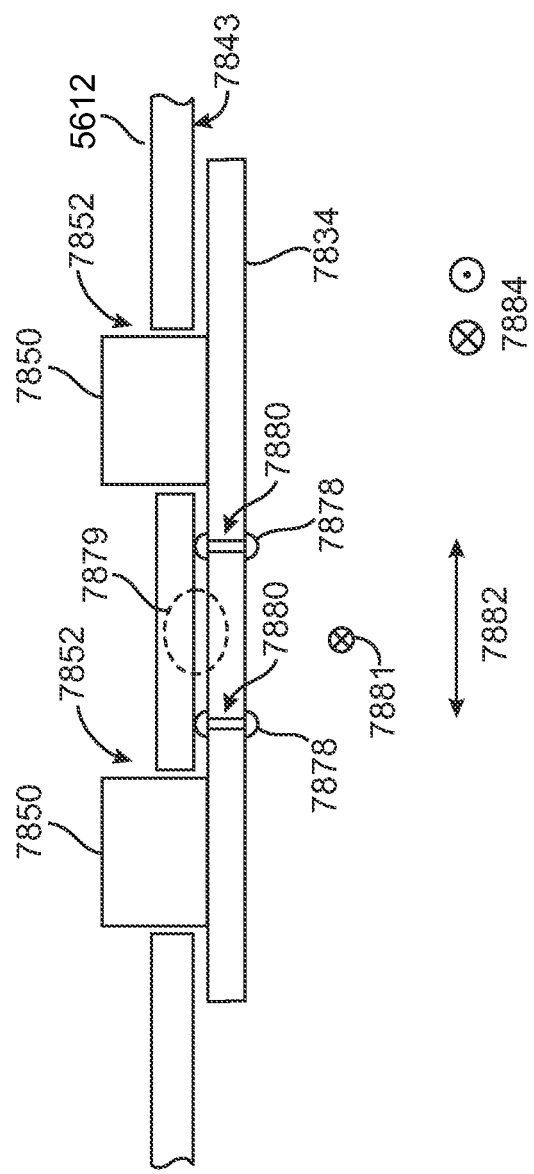
FIG. 36 is a side cross-sectional view showing how nubs may be inserted in a button plate of a button assembly in accordance with an embodiment of the present invention.

FIG. 36 shows an example of a button plate having nubs such as nubs 7878. Nubs 7878 may be formed from silicone or other suitable materials. Nubs 7878 may be inserted through holes 7880 in button plate 7834 and may protrude on either side of button plate 7834. In FIG. 36, two button members 7850 are attached to button plate 7834 (e.g., to form a rocker switch in which plate 7834 pivots about pivot axis 7881). In general, any suitable number of button members 7850 may be attached to button plate 7834. Button members 7850 protrude from openings 7852 in housing structure 5612. Nubs 7878 may contact inside surface 7843 of housing structure 5612. Nubs 7878 may reduce side-to-side motion of button members 7850 within openings 7852. For example, nubs 7878 may reduce motion of button members 7850 and button plate 7834 in side-to-side directions 7882 and 7884. Nubs may prevent metal-on-metal contact, such as contact between button plate 7834 and housing structure 5612 in region 7879.

Figure 37:
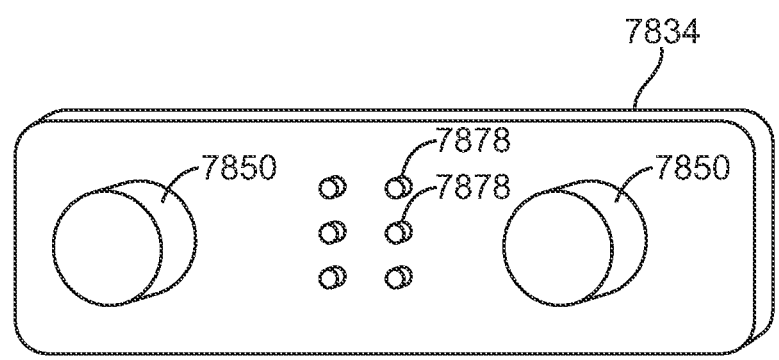
FIG. 37 is a top perspective view of nubs inserted in a button plate in accordance with an embodiment of the present invention.

A top perspective view of button plate 7834 having elastomeric members such as nubs 7878 is shown in FIG. 37. In the example of FIG. 37, six nubs 7878 are shown positioned in rows and columns between button members 7850. In general, any suitable number of nubs 7878 may be used. Button plate 7834 may have, for example, two nubs or more nubs, four or more nubs, six or more nubs, etc. Nubs 7878 may be arranged in arrays or other configurations.

Figure 38:
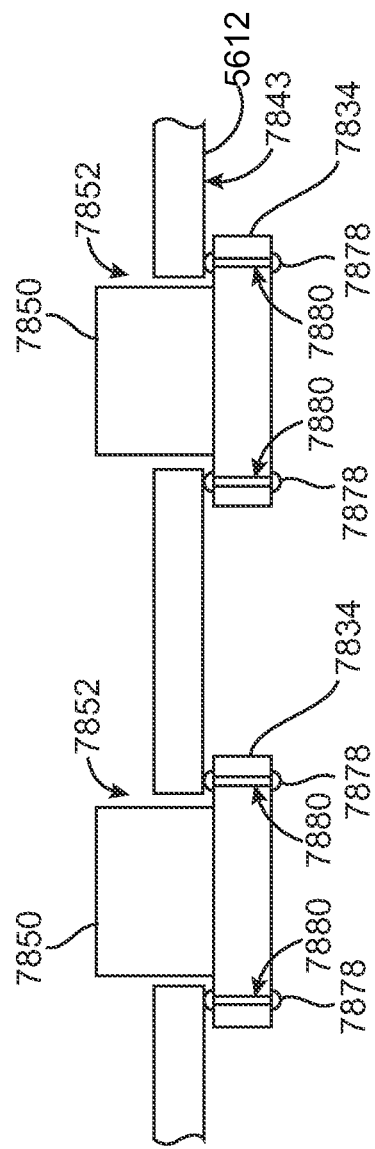
FIG. 38 is a side cross-sectional view of nubs inserted in button plates in accordance with an embodiment of the present invention.

FIG. 38 is a cross-sectional side view of two button plates 7834 each having one button member 7850. Button plates 7834 may have nubs 7878 inserted in holes 7880. Button members 7850 may protrude from openings 7852 in housing structure 5612. Nubs 7878 may rest against inside surface 7843 of housing structure 5612. In the example of FIG. 38, nubs 7878 are shown positioned on either side of each button member 7850. In general, nubs 7878 may be positioned in any suitable configuration.

Figure 39:
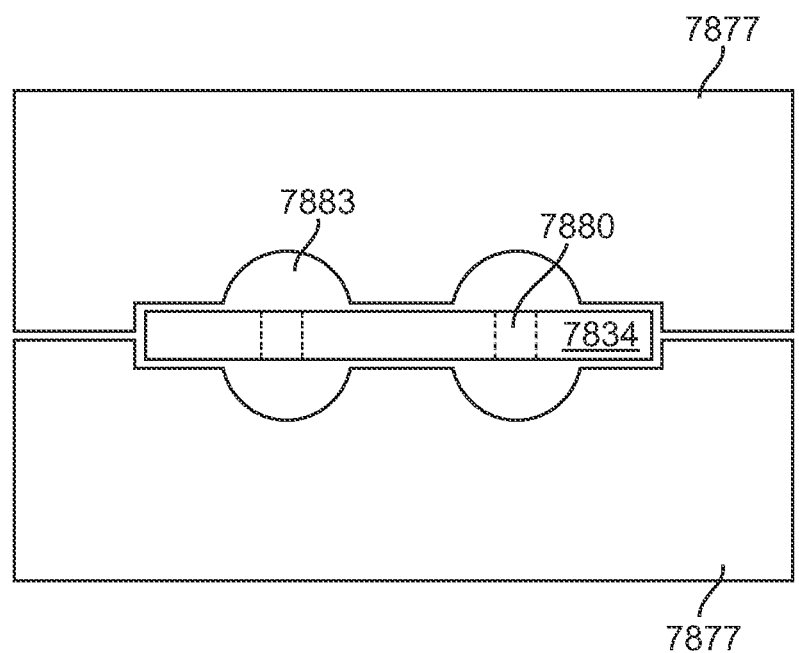
FIG. 39 is a side cross-sectional view of a tool that may be used to form nubs in a button plate in accordance with an embodiment of the present invention.

Nubs 7878 may be formed by compression molding. FIG. 39 shows molds 7877 that may be used to form nubs 7878. Molds 7877 may be placed around button plate 7834. Button plate 7834 may have holes 7880. An elastomeric material such as silicone may be placed in cavity 7883 of molds 7877. Pressure and heat may be applied until the material has attained its desired form.

Figure 40:
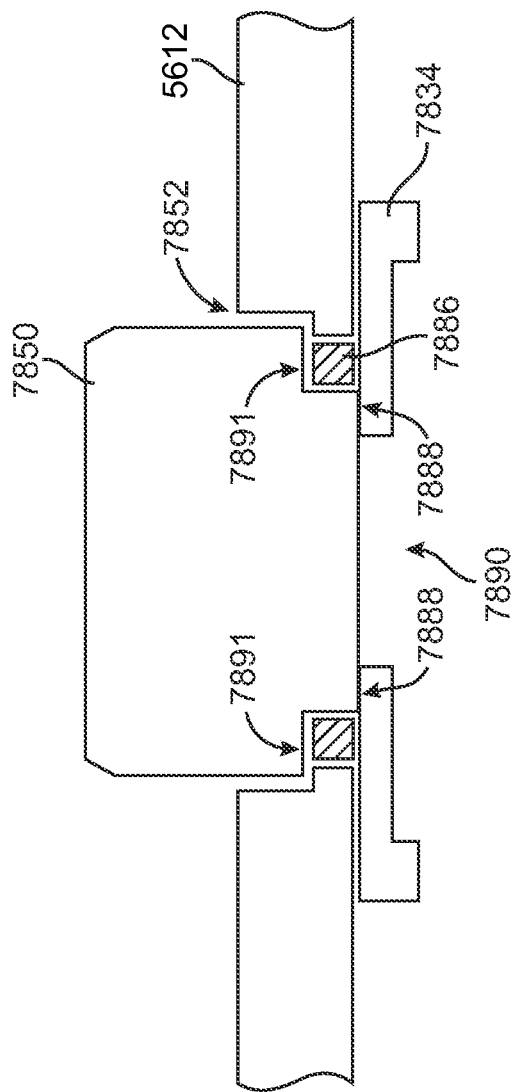
FIG. 40 is a side cross-sectional view of a ring surrounding a button member in a button assembly in accordance with an embodiment of the present invention.
Figure 41:
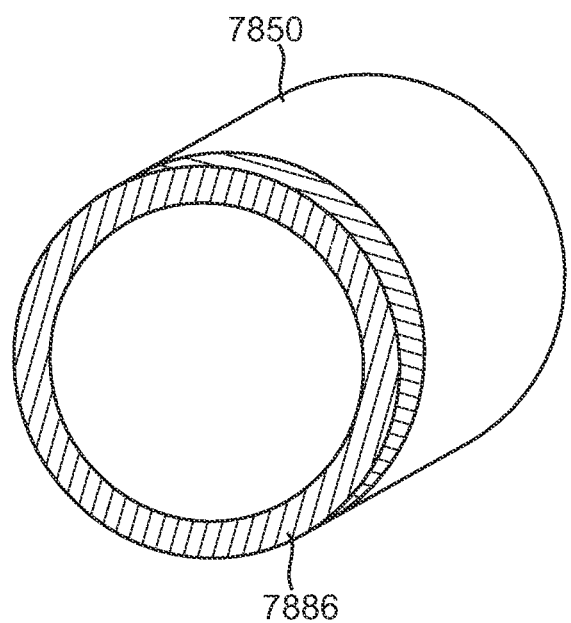
FIG. 41 is a bottom perspective view of a ring surrounding a button member in accordance with an embodiment of the present invention.

FIG. 40 is a side cross-section view of button member 7850 inserted through opening 7852 of housing structure 5612. A ring such as ring 7886 may surround button member 7850. Ring 7886 may be formed from an elastomeric material such as plastic or silicone. Ring 7886 may serve as a gasket that prevents button member 7850 from directly contacting housing structure 5612 when button member 7850 reciprocates in opening 7852. Ring 7886 may be similar to an "O-ring" that is stretched over button member 7850. Ring 7886 may be formed by depositing a coating on button member 7850 such as a plastic coating or other coating layer that is softer than metal. If desired, button member 7850 may have a recessed notch such as inset 7891 to accommodate ring 7886. Button member 7850 may be attached to button plate 7834. Button member 7850 may be welded at points 7888 to button plate 7834. In the example of FIG. 40 button plate 7834 is shown as having an opening 7890. However this is merely illustrative. Ring 7886 may be serve as a rattle prevention ring. Ring 7886 may reduce the rattling of button member 7850 by preventing metal-on-metal collisions during movement of device 10. Ring 7886 may also reduce the noise from the rattling of button member 7850. Ring 7886 may aid in environmental sealing around button member 7850. FIG. 41 is a bottom perspective view of button member 7850 having ring 7886.

Figure 42:
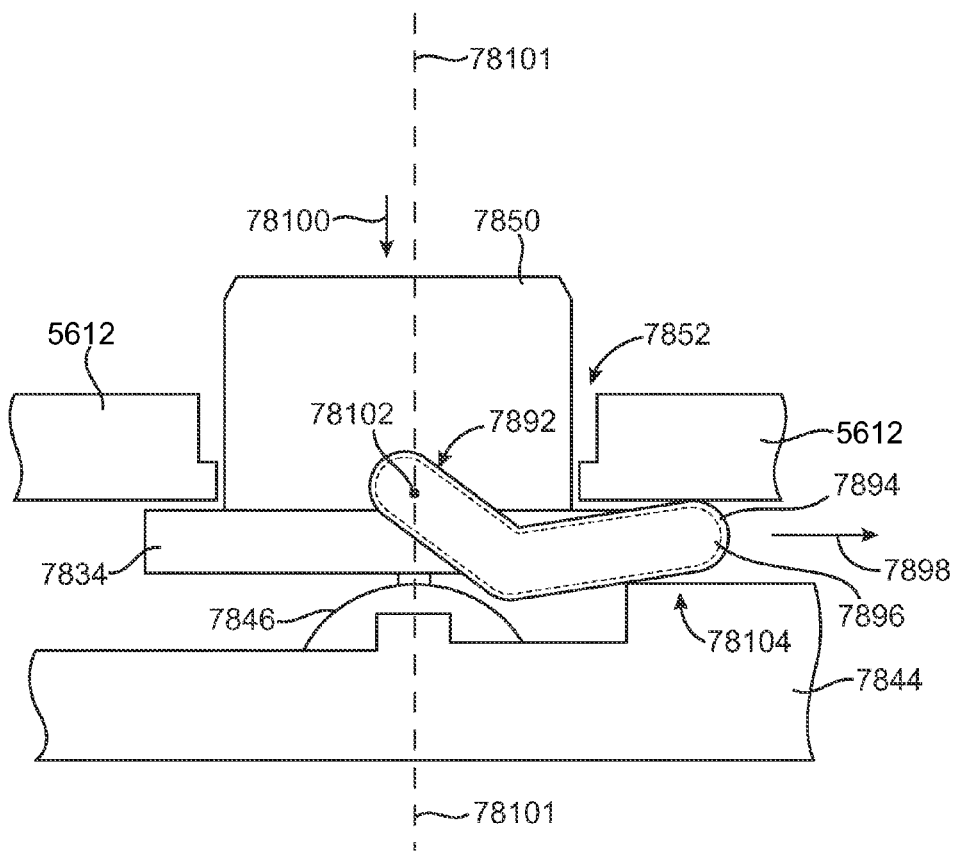
FIG. 42 is a side cross-sectional view of a button assembly having a coated anti-roll bar in accordance with an embodiment of the present invention.

If desired, buttons may have an associated anti-roll bar. As shown in the example of FIG. 42, anti-roll bar 7892 may be attached to button member 7850. Anti-roll bar 7892 may prevent button member 7850 from tilting when button member 7850 is pressed by a user. Button member 7850 may be attached to button plate 7834. Button member 7850 may reciprocate along axis 78101 within opening 7852 in housing structure 5612. Button plate 7834 may press against dome switch 7846 mounted on button bracket 7844. Anti-roll bar 7892 may pivot around pivot 78102 and may reciprocate within a groove such as groove 78104 between housing structure 5612 and button bracket 7844. When a user presses on button member 7850 (i.e., in direction 78100), anti-roll bar 7892 may pivot counterclockwise around pivot 78102 and slide in direction 7898 within groove 78104. Anti-roll bar 7892 may guide the movement of button member 7850 and may aid button member 7850 in pressing evenly against dome switch 7846.

Anti-roll bar 7892 may be formed from metal. Housing structure 5612 and button bracket 7844 may also be formed from metal. If desired, anti-roll bar 7892 may be provided with a core 7896 formed from metal and a lubricating coating 7894. Coating 7894 may a polymer or plastic material such as silicone that reduces friction between anti-roll bar 7892, housing 5612, and bracket 7844 (e.g., in groove 78104). Coating 7894 may be applied to bar 7892 using techniques such as dip coating, pad printing, painting, electrostatic painting, powder coating, sputtering, or heat shrinking. Anti-roll bar 7892 may also be formed from a coated wire.

Figure 43:
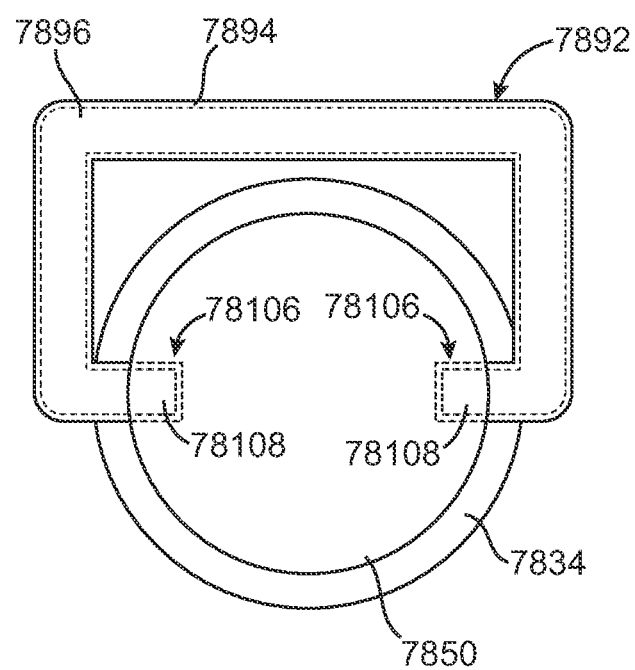
FIG. 43 is a diagram of a coated anti-roll bar attached to a button member in accordance with an embodiment of the present invention.

FIG. 43 is a diagram of button member 7850 and anti-roll bar 7892 when viewed in direction 78100 of FIG. 42. Anti-roll bar 7892 may be substantially U-shaped with three sides. Anti-roll bar 7892 may have tips 78108 that are inserted into openings 78106 in button member 7850. Bar tips 78108 in openings 78106 may form a pin-in-hole joints or "revolute joints". Bar 7892 may have a coating such as coating 7894 over a core 7896. Core 7896 may be formed from metal. Coating 7894 may be formed from a polymer to prevent undesired metal-on-metal friction when bar tips 78108 pivots within openings 78106.

Figure 44:
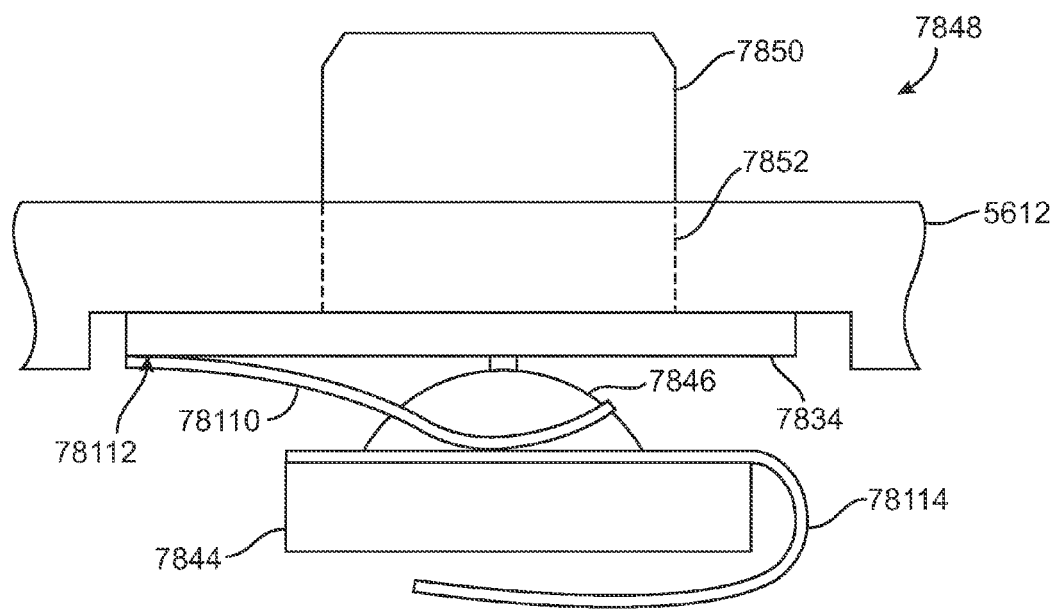
FIG. 44 is a side view of a button assembly having a bias spring in accordance with an embodiment of the present invention.

If desired, a spring such as a bias spring may be used to minimize rattle in button assemblies. FIG. 44 is a side view of a button assembly that has bias spring 78110. Button member 7850 may be attached to button plate 7834. Button member 7850 may be inserted through an opening such as opening 7852 in housing structure 5612. Button member 7850 and button plate 7834 may press against dome switch 7846 on button bracket 7844. If desired, button bracket 7844 may have a flex circuit such as flex circuit 78114 that may be used for dome switch electronics. A spring such as spring 78110 may be attached to button plate 7834. Spring 78110 may be welded to button plate 7834 at location 78112. Spring 78110 may be known as a bias spring or a clip. Spring 78110 may bias button plate 7834 against button bracket 7844. If bracket 7844 has a flex circuit such as flex circuit 78114, spring 78110 may rest against or adjacent to flex circuit 78114. Spring 78110 may help reduce rattle in button assembly 7848. Spring 78110 may also help secure button plate 7834 against housing structure 5612. Spring 78110 may also guide button member 7850 as it reciprocates within opening 7852 of housing structure 5612.

Figure 45:
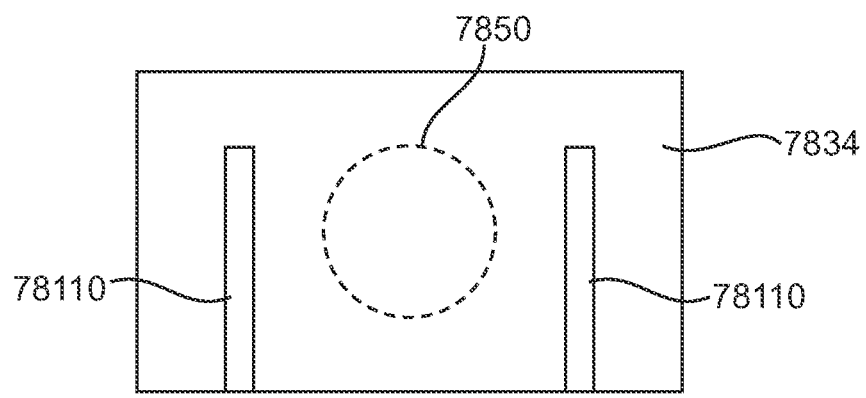
FIG. 45 is bottom view of a button plate having bias springs in accordance with an embodiment of the present invention.

FIG. 45 is a bottom view of button plate 7834 of FIG. 44. Button plate 7834 may have springs 78110 located on either side of button member 7850. Springs 78110 may press on button bracket 7844 on either side of dome switch 7846 (see, e.g., FIG. 44).

Figure 46:
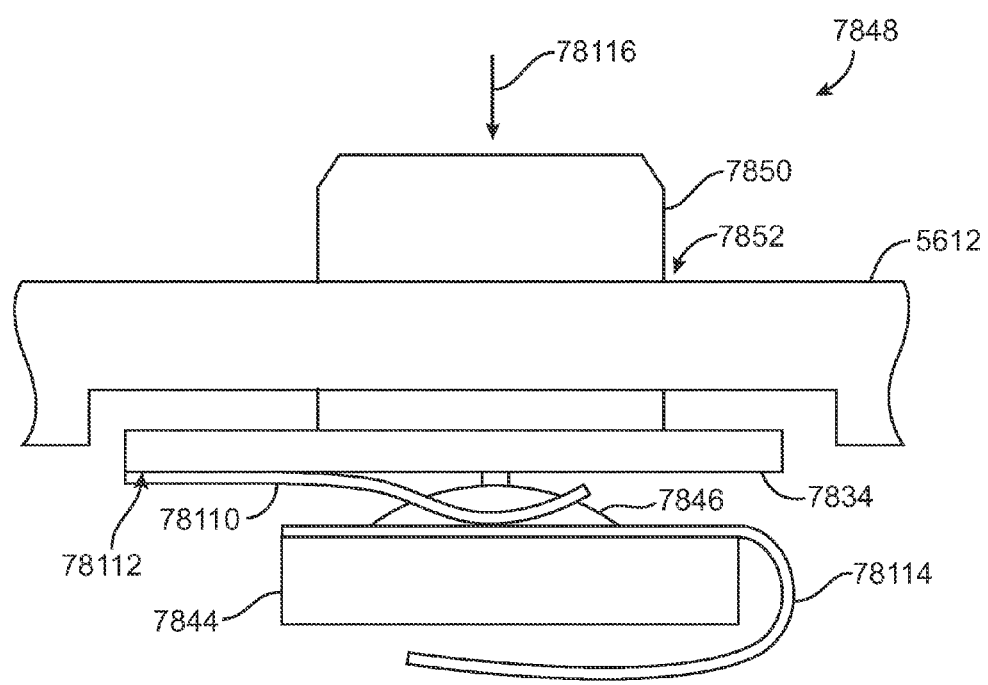
FIG. 46 is a side view of a button assembly having a bias spring that is compressed when a button member is pressed in accordance with an embodiment of the present invention

When button member 7850 is pressed by a user, spring 78110 may compress, as shown in the example of FIG. 46. In FIG. 46, button member 7850 has been pressed by a user in the direction of arrow 78116. Button member 7850 is therefore in a depressed position. Spring 78110 may aid in guiding button member 7850 so that button member 7850 presses squarely onto dome switch 7846.

The foregoing is merely illustrative of the principles of this invention and various modifications can be made by those skilled in the art without departing from the scope and spirit of the invention.

What is claimed is:

1. An electronic device comprising:
    a button plate comprising:
        at least one button member; and
        at least one opening formed in the button plate located adjacent to the at least one button member;
    a housing structure having at least one opening through which the button member protrudes for actuation by a user; and at least one spring located adjacent to the at least one button member that attaches the button plate to the housing structure such that the at least one spring protrudes through the at least one opening of the button plate;
    wherein the at least one spring comprises leaves that retain the button plate against the housing structure and the at least one spring comprises a threaded bore that forms a first screw boss.

2. The electronic device defined in claim 1, further comprising a dome switch assembly attached to the screw boss.

3. The electronic device defined in claim 1, wherein the button plate comprises two slots on opposing sides of each opening of the at least one opening of the button plate.

4. The electronic device defined in claim 1, wherein:
    the at least one spring comprises one of a plurality of springs;
    the button plate comprises sides; and
    the plurality of springs press against the sides of the button plate such that the button plate presses against an interior surface of the housing structure.

5. The electronic device defined in claim 1, wherein the housing structure comprises a metal housing structure.

6. The electronic device defined in claim 1, wherein the electronic device comprises four sides, and wherein the housing structure comprises a metal band that surrounds the four sides.

7. The electronic device defined in claim 1, further comprising a dome switch assembly comprising at least one dome switch that is controlled by moving the at least one button member.

8. The electronic device of claim 1, wherein:
    at least a portion of the at least one button member is retained within the housing structure; and
    the button plate is completely enclosed within the housing structure.

9. The electronic device defined in claim 1, wherein the at least one button member comprises two button members, and the at least one spring spring resides between the two button members.

10. The electronic device defined in claim 1, wherein the at least one button member comprises two button members, and the button plate further comprises two slots that reside between the two button members and are located on either side of the at least one opening of the button plate.

11. The electronic device defined in claim 1, further comprising a button bracket situated substantially parallel to the button plate and coupled to the housing structure.

12. The electronic device of claim 1, wherein the at least one spring further comprises a second screw boss, the first and second screw bosses located adjacent to sides of the button plate.

13. The electronic device defined in claim 4, wherein the plurality of springs comprises at least four springs.

14. The electronic device defined in claim 8, wherein:
    the at least one button member comprises two button members;
    the dome switch assembly comprises two dome switches;
    the housing structure comprises at least one screw boss; and
    the dome switch assembly attaches to the screw boss so that each of the two button members controls a respective one of the two dome switches.

15. The electronic device of claim 12, further comprising a third screw boss aligned with the at least one spring.

16. The electronic device of claim 15, further comprising a button bracket attached to the housing structure via the first and second screw bosses and attached to the button plate via the third screw boss.

17. The electronic device of claim 16, wherein the button bracket comprises at least one opening corresponding respectively to each of the first, second, and third screw bosses.

\* \* \* \* \*